United States Patent
Warashina

(10) Patent No.: US 9,577,402 B2
(45) Date of Patent: Feb. 21, 2017

(54) VARIABLE-WAVELENGTH LIGHT SOURCE

(71) Applicant: HAMAMATSU PHOTONICS K.K., Hamamatsu-shi, Shizuoka (JP)

(72) Inventor: Yoshihisa Warashina, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/909,767

(22) PCT Filed: Jun. 26, 2014

(86) PCT No.: PCT/JP2014/067056
§ 371 (c)(1),
(2) Date: Feb. 3, 2016

(87) PCT Pub. No.: WO2015/019739
PCT Pub. Date: Feb. 12, 2015

(65) Prior Publication Data
US 2016/0190765 A1 Jun. 30, 2016

(30) Foreign Application Priority Data
Aug. 5, 2013 (JP) .................................. 2013-162445

(51) Int. Cl.
*H01S 3/106* (2006.01)
*G02B 26/00* (2006.01)
(Continued)

(52) U.S. Cl.
CPC .............. *H01S 3/1062* (2013.01); *G01J 3/10* (2013.01); *G02B 26/001* (2013.01); *H01S 3/07* (2013.01); *H01S 3/0809* (2013.01); *H01S 3/0823* (2013.01); *H01S 3/08027* (2013.01); *H01S 5/1092* (2013.01); *H01S 5/142* (2013.01);
(Continued)

(58) Field of Classification Search
CPC .. H01S 3/1062; H01S 3/0809; H01S 3/08027; H01S 3/07; H01S 3/0823; H01S 3/025; H01S 3/105; H01S 3/08086
See application file for complete search history.

(56) References Cited

U.S. PATENT DOCUMENTS 7,970,032 B2 * 6/2011 He .......................... G01V 1/181
356/486
2015/0003487 A1 * 1/2015 Gao ...................... H01S 3/1062
372/107

FOREIGN PATENT DOCUMENTS

JP       H02-152288 A    6/1990
JP       2000-028931 A    1/2000
(Continued)

*Primary Examiner* — Dung Nguyen
(74) *Attorney, Agent, or Firm* — Drinker Biddle & Reath LLP

(57) ABSTRACT

A variable-wavelength light source is provided with a first laser medium, a first optical resonator constituted of a total reflection mirror and a half-mirror, a second laser medium, a second optical resonator constituted of a total reflection mirror and the half-mirror, a first filter having a pair of first mirrors configured to cause first light and second light to be transmitted and reflected selectively, a second filter having a pair of second mirrors configured to cause the first light and the second light to be transmitted and reflected selectively, a first drive mechanism configured to operate the first mirror and the second mirror in conjunction with each other, and a second drive mechanism configured to operate the second mirror.

6 Claims, 21 Drawing Sheets

(51) Int. Cl.

| | |
|---|---|
| *G01J 3/10* | (2006.01) |
| *H01S 3/07* | (2006.01) |
| *H01S 3/08* | (2006.01) |
| *H01S 3/082* | (2006.01) |
| *H01S 5/14* | (2006.01) |
| *H01S 5/10* | (2006.01) |
| H01S 5/183 | (2006.01) |
| H01S 3/105 | (2006.01) |
| H01S 5/022 | (2006.01) |
| H01S 3/02 | (2006.01) |

(52) U.S. Cl.
CPC ........... *H01S 3/025* (2013.01); *H01S 3/08059* (2013.01); *H01S 3/08086* (2013.01); *H01S 3/105* (2013.01); *H01S 5/02248* (2013.01); *H01S 5/02288* (2013.01); *H01S 5/183* (2013.01)

(56) References Cited

FOREIGN PATENT DOCUMENTS

| | | |
|---|---|---|
| JP | 3450180 B2 | 9/2003 |
| JP | 2003-324227 A | 11/2003 |
| JP | 2009-163779 A | 7/2009 |
| JP | 2009-267037 A | 11/2009 |
| JP | 2010-087472 A | 4/2010 |

* cited by examiner

*Fig.3*
(a)
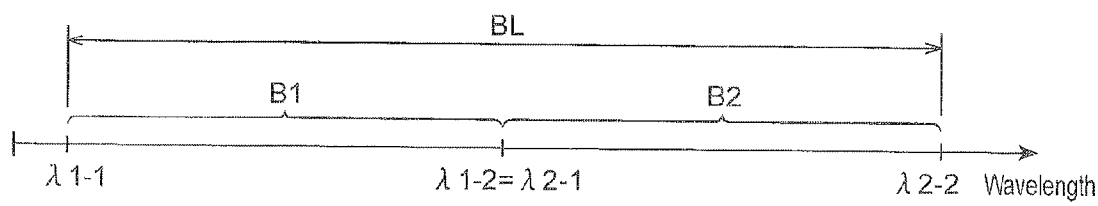
(b)
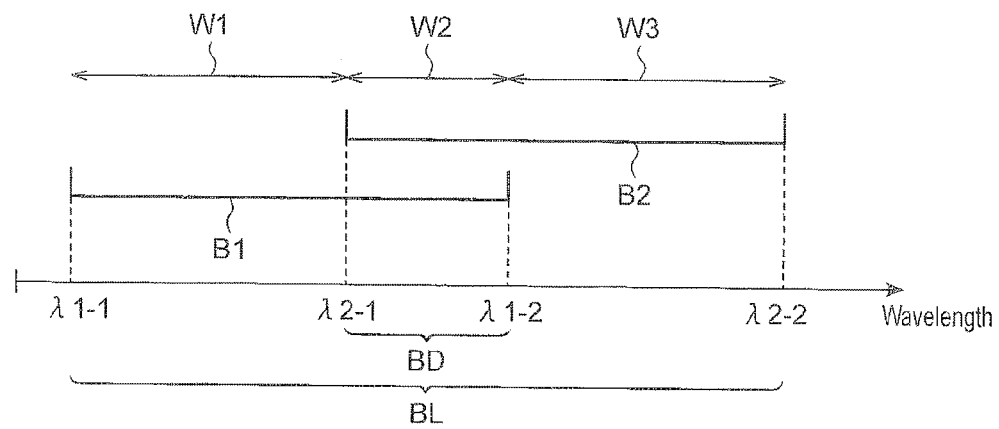

Fig.4

| State | First oscillation state | Second oscillation state | First non-oscillation state | Second non-oscillation state |
|---|---|---|---|---|
| First Fabry-Perot filter FP1 | Transmit light of band B1 | Transmit light of band B2 | Transmit light of band B2 | Transmit light of band B1 |
| Second Fabry-Perot filter FP2 | Reflect light of band B1 | Transmit light of band B2 | Reflect light of band B2 | Transmit light of band B1 |
| First laser medium M1 | Oscillate | Do not oscillate | Do not oscillate | Do not oscillate |
| Second laser medium M2 | Do not oscillate | Oscillate | Do not oscillate | Do not oscillate |

*Fig.5*
(a)
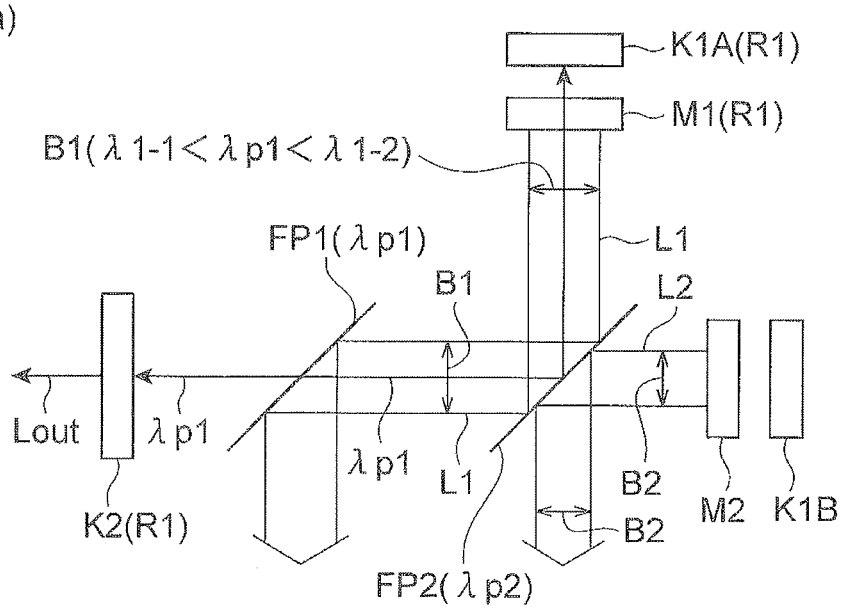
(b)
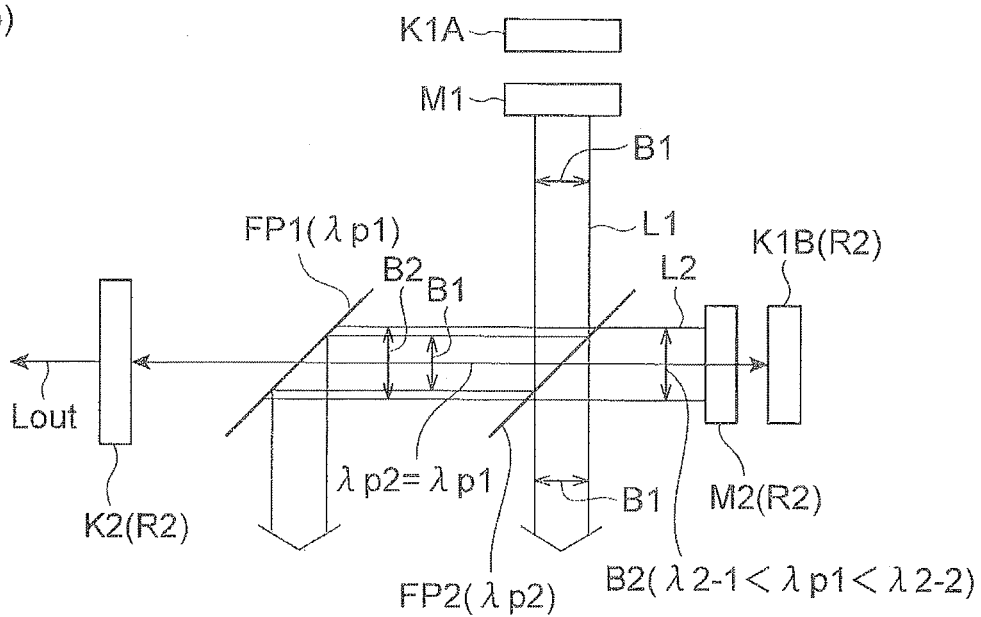

Fig.7
(a)
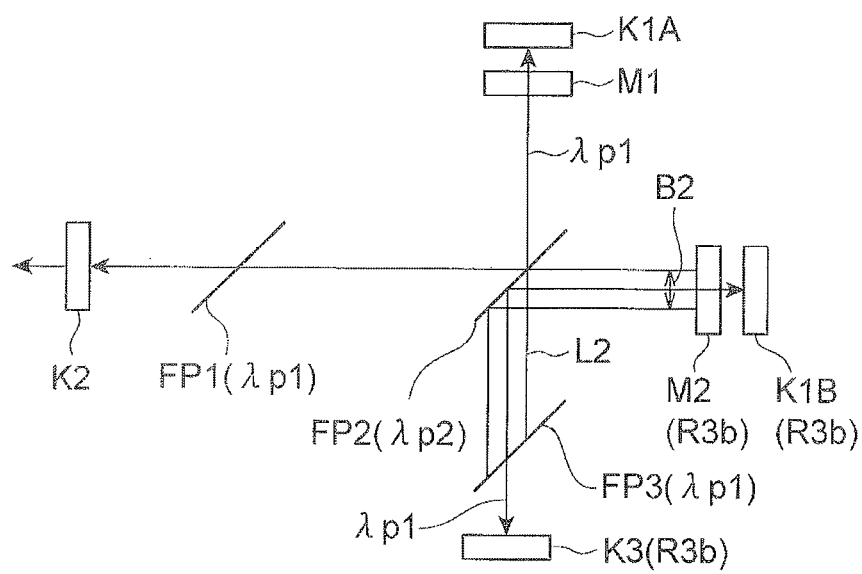
(b)
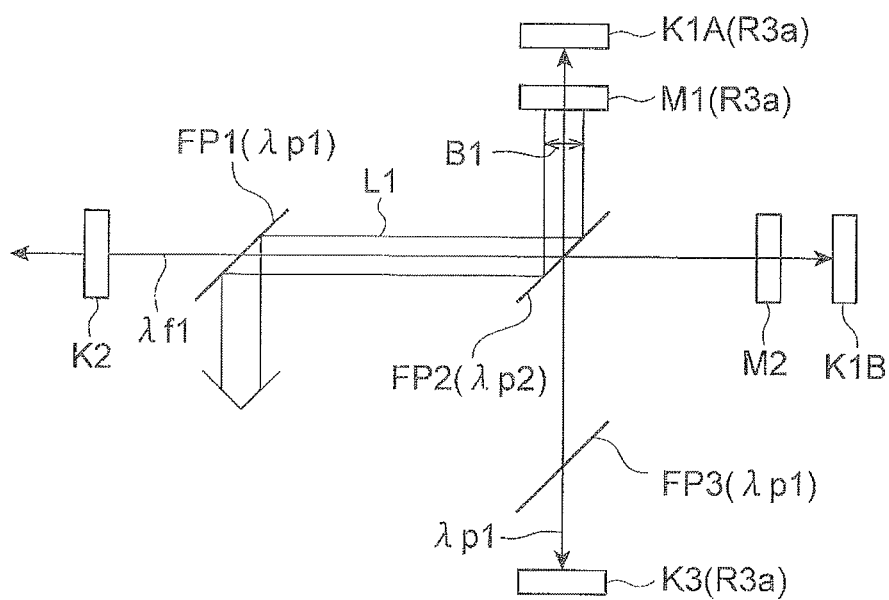

Fig.10
(a)
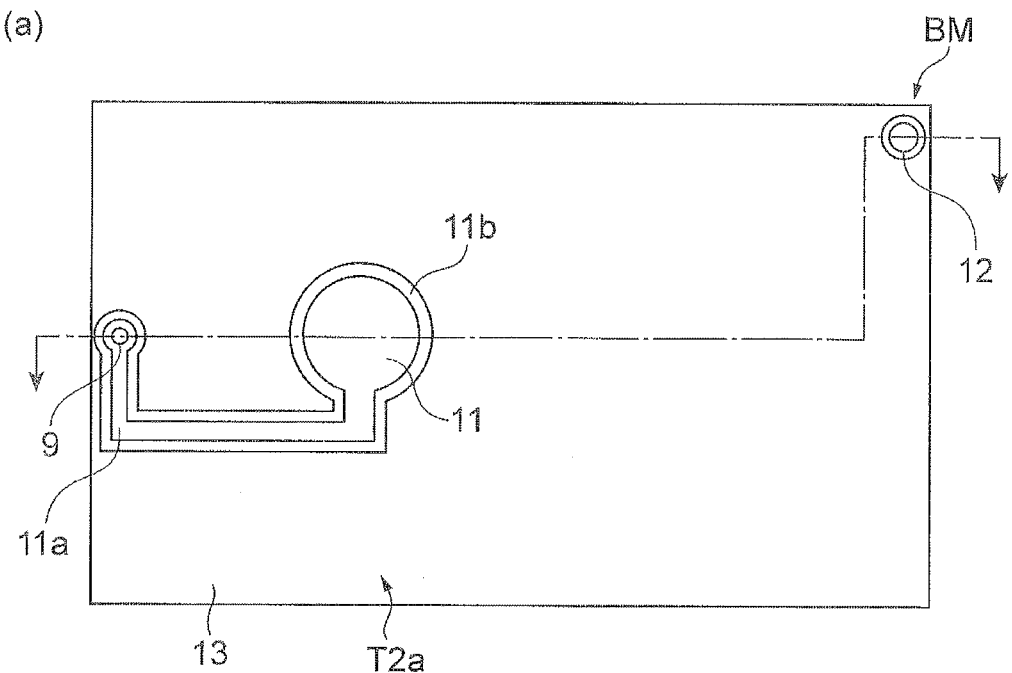
(b)
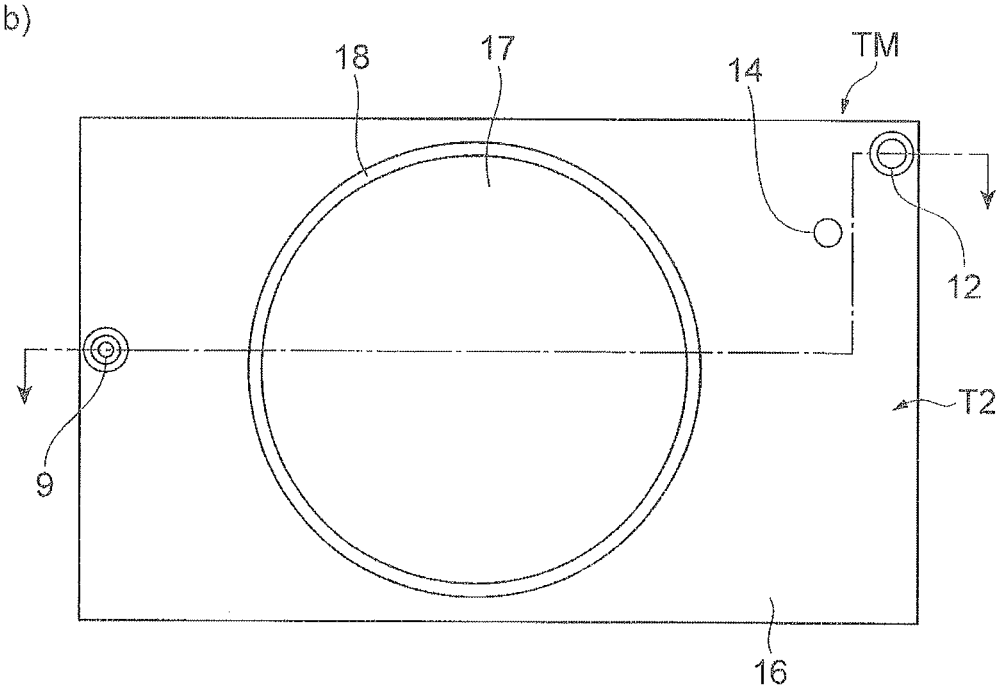

Fig.11
(a)
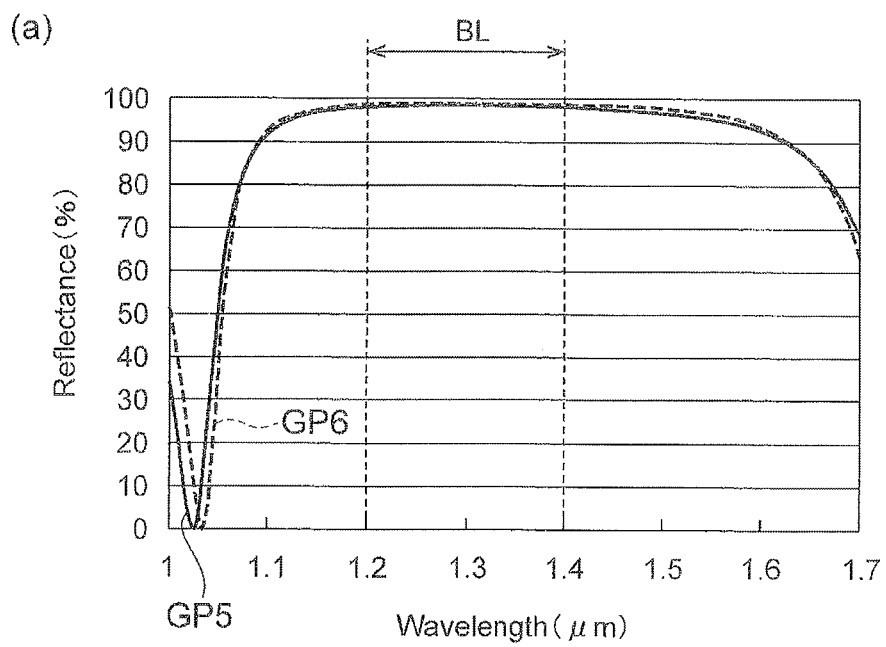
(b)
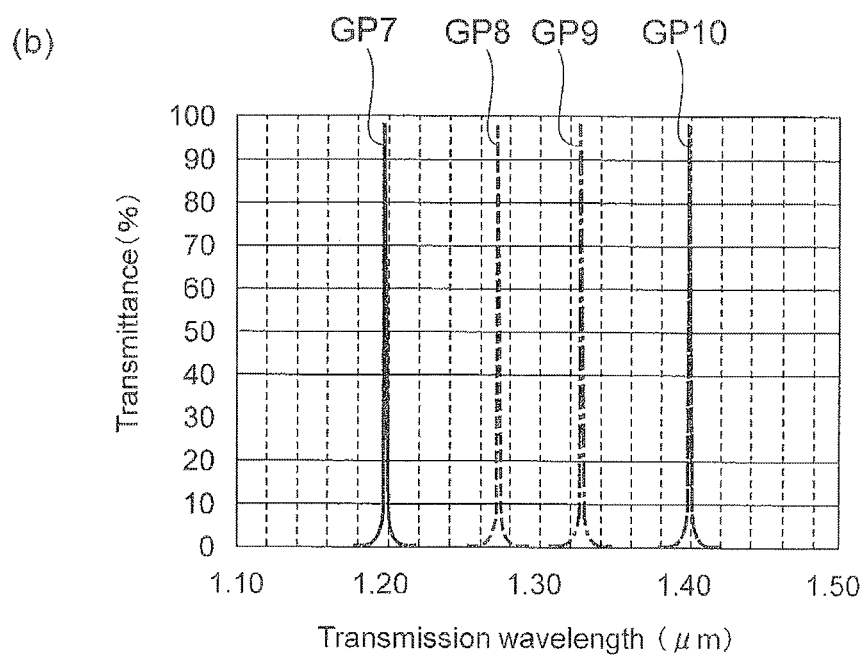

VARIABLE-WAVELENGTH LIGHT SOURCE

TECHNICAL FIELD

The present invention relates to a variable-wavelength light source.

BACKGROUND ART

Conventionally, variable-wavelength light sources are used as communication lasers for wavelength multiplex communication and tuned to specific wavelengths for use. Variable-wavelength light sources are capable of high efficiency, high precision, size reduction, and high speeds. Variable-wavelength light sources are attracting attention because they are also applicable to simple spectrometers, tomographic image acquisition devices, etc. Technologies related to variable-wavelength light sources are disclosed in Patent Literatures 1 and 2.

In Patent Literature 1, a variable-wavelength laser is disclosed. The variable-wavelength laser is easily manufactured in a small size and has high power in a wide variable-wavelength range. This variable-wavelength laser includes an external resonator and a transmission Fabry-Perot interference filter. The external resonator is constituted of one laser element and a pair of reflection mirrors. The transmission Fabry-Perot interference filter is arranged to be tilted toward an optical path within the external resonator. The transmission Fabry-Perot interference filter is a Fabry-Perot type filter formed in micro-machine technology. The transmission Fabry-Perot interference filter changes a transmission wavelength by controlling a gap between two thin-film mirrors. The variable-wavelength laser changes an oscillation wavelength of emission light by controlling a transmission wavelength of the transmission Fabry-Perot interference filter.

In Patent Literature 2, a light-emitting apparatus having a wide variable-wavelength band is disclosed. This light-emitting apparatus includes a plurality of surface light-emitting lasers and a control unit. The plurality of surface light-emitting lasers have different wavelength bands from one another. The control unit variably controls a wavelength of light emitted from the light-emitting apparatus using a total wavelength band in which the wavelength bands are combined as a variable-wavelength band. The control unit changes the wavelength of light radiated from the surface light-emitting laser by controlling an amount of electric current to be supplied to each surface light-emitting laser.

CITATION LIST

Patent Literature

[Patent Literature 1] Japanese Patent No. 3450180
[Patent Literature 2] Japanese Unexamined Patent Application, First Publication No. 2009-163779

SUMMARY OF INVENTION

Technical Problem

However, in the variable-wavelength laser disclosed in the above-described Patent Literature 1, the wavelength band of emission light of the variable-wavelength laser is determined based on a wavelength band of light emitted from a laser element. Accordingly, it is difficult to extend the wavelength band of emission light of the variable-wavelength laser to a wavelength band greater than or equal to that of the light emitted from the laser element. In the light-emitting apparatus disclosed in the above-described Patent Literature 2, an operation state of the surface light-emitting laser is not constant because the amount of electric current to be supplied to the surface light-emitting surface is controlled. Accordingly, optical characteristics of the emission light emitted from the light-emitting apparatus may be unstable.

Therefore, an objective of the present invention is to provide a variable-wavelength light source capable of stabilizing optical characteristics of emission light and extending a wavelength band of the emission light.

Solution to Problem

According to an aspect of the present invention, a variable-wavelength light source includes a first laser medium configured to amplify first light having a first wavelength band; a first total reflection mirror and a first partial reflection mirror constituting a first optical resonator configured to cause the first light to optically resonate; a second laser medium configured to amplify second light having a second wavelength band; a second total reflection mirror and a second partial reflection mirror constituting a second optical resonator configured to cause the second light to optically resonate; a first Fabry-Perot interference filter having a pair of first mirrors, arranged at a first position which is a position between the first laser medium and the first partial reflection mirror on a first optical path of the first light and is a position between the second laser medium and the second partial reflection mirror on a second optical path of the second light, and configured to cause the first light and the second light to be transmitted and reflected selectively; a second Fabry-Perot interference filter having a pair of second mirrors, arranged at a second position which is a position between the first laser medium and the first Fabry-Perot interference filter on the first optical path and is a position between the second laser medium and the first Fabry-Perot interference filter on the second optical path, and configured to cause the first light and the second light to be transmitted and reflected selectively; a first drive mechanism configured to operate one first mirror of the first Fabry-Perot interference filter and one second mirror of the second Fabry-Perot interference filter in conjunction with each other; and a second drive mechanism configured to operate the other second mirror of the second Fabry-Perot interference filter.

This variable-wavelength light source includes the first and second laser media configured to amplify light of different wavelength bands. Because the wavelength band of the emission light of the variable-wavelength light source is a combination of wavelength bands of light emitted from the laser media, it is possible to extend the wavelength band of the emission light of the variable-wavelength light source. The first drive mechanism operates the one first mirror and the one second mirror in conjunction with each other and the second drive mechanism operates the other second mirror. Through this configuration, transmission wavelengths of the first and second Fabry-Perot interference filters can be identical or different. According to a combination of the transmission wavelengths of the first and second Fabry-Perot interference filters, the first optical resonator configured to cause the first light to optically resonate and the second optical resonator configured to cause the second light to optically resonate are selectively configured. Thus, while operation states of the first and second laser media are constantly maintained, it is possible to switch the laser media to cause oscillation to be performed. Therefore, the variable-wavelength light source can stabilize optical characteristics of the emission light and extend the wavelength band of the emission light.

According to an aspect of the present invention, the variable-wavelength light source may further include: a control unit configured to control the first drive mechanism so that a first gap between the pair of first mirrors and a second gap between the pair of second mirrors periodically change. The transmission wavelength of the Fabry-Perot interference filter is based on a gap between the pair of mirrors constituting the Fabry-Perot interference filter. When the first and second gaps are changed, the transmission wavelength of the first Fabry-Perot interference filter and the transmission wavelength of the second Fabry-Perot interference filter periodically change. Accordingly, it is possible to periodically change the wavelength of the emission light of the variable-wavelength light source.

According to an aspect of the present invention, in the variable-wavelength light source, the control unit may cause the one first mirror and the one second mirror to reciprocate and set a frequency of the reciprocating operation to a resonance frequency of the first drive mechanism. Through this control unit, the first mirror and the second mirror reciprocate at a resonance frequency of the first drive mechanism. Accordingly, energy necessary to drive the first and second mirrors at predetermined amplitude is suppressed and it is possible to cause the first and second mirrors to reciprocate with high efficiency at a high frequency.

According to an aspect of the present invention, in the variable-wavelength light source, the control unit may control the second drive mechanism so that a state of the second mirror is switched between a first state in which the second gap is different from the first gap and a second state in which the second gap is equal to the first gap. According to this control unit, in the first state in which the second gap is different from the first gap, it is possible to cause the transmission wavelength of the second Fabry-Perot interference filter to be different from the transmission wavelength of the first Fabry-Perot interference filter. On the other hand, in the second state in which the second gap is equal to the first gap, it is possible to cause the transmission wavelength of the second Fabry-Perot interference filter to be equal to the transmission wavelength of the first Fabry-Perot interference filter.

According to an aspect of the present invention, in the variable-wavelength light source, the first Fabry-Perot interference filter, the second Fabry-Perot interference filter, the first drive mechanism, and the second drive mechanism may be formed in the same semiconductor substrate. This configuration is a configuration of a so-called micro electro mechanical systems (MEMS) device in which a mechanical structure is formed in a semiconductor substrate. Through this configuration, the first Fabry-Perot interference filter, the second Fabry-Perot interference filter, the first drive mechanism, and the second drive mechanism are formed in the semiconductor substrate through a semiconductor process. Therefore, it is possible to easily manufacture a configuration in which the above-described components are precisely positioned.

According to an aspect of the present invention, the variable-wavelength light source may further include: a first optical component arranged at a position between the first laser medium and the second Fabry-Perot interference filter on the first optical path and configured to collimate the first light; and a second optical component arranged at a position between the second laser medium and the second Fabry-Perot interference filter on the second optical path and configured to collimate the second light. Through this configuration, it is possible to efficiently use the first light amplified by the first laser medium and the second light amplified by the second laser medium.

Advantageous Effects of Invention

According to the present invention, a variable-wavelength light source capable of stabilizing optical characteristics of emission light and extending a wavelength band of the emission light is provided.

BRIEF DESCRIPTION OF DRAWINGS

FIG. 3 is a diagram illustrating relationships among a wavelength band of emission light, a first wavelength band, and a second wavelength band in the variable-wavelength light source of FIG. 1.

FIG. 4 is a table illustrating an oscillation state in the variable-wavelength light source of FIG. 1.

FIG. 5(a) is a diagram illustrating a first oscillation state in the variable-wavelength light source of FIG. 1 and FIG. 5(b) is a diagram illustrating a second oscillation state.

FIG. 7(a) is a diagram illustrating a first oscillation state in the variable-wavelength light source of FIG. 1 and FIG. 7(b) is a diagram illustrating a second oscillation state.

FIG. 10 is a top view of a variable-wavelength light source of FIG. 8.

FIG. 11(a) is a graph illustrating wavelength characteristics of a Bragg mirror of the variable-wavelength light source of FIG. 8 and FIG. 11(b) is a graph illustrating wavelength characteristics of a Fabry-Perot interference filter.

DESCRIPTION OF EMBODIMENTS

Hereinafter, modes for carrying out the present invention will be described in detail with reference to the accompanying drawings. In the description of the drawings, the same reference signs are assigned to the same or similar parts and redundant description thereof will be omitted.

[First Embodiment]

<Basic Configuration of Variable-Wavelength Light Source>

Figure 1:
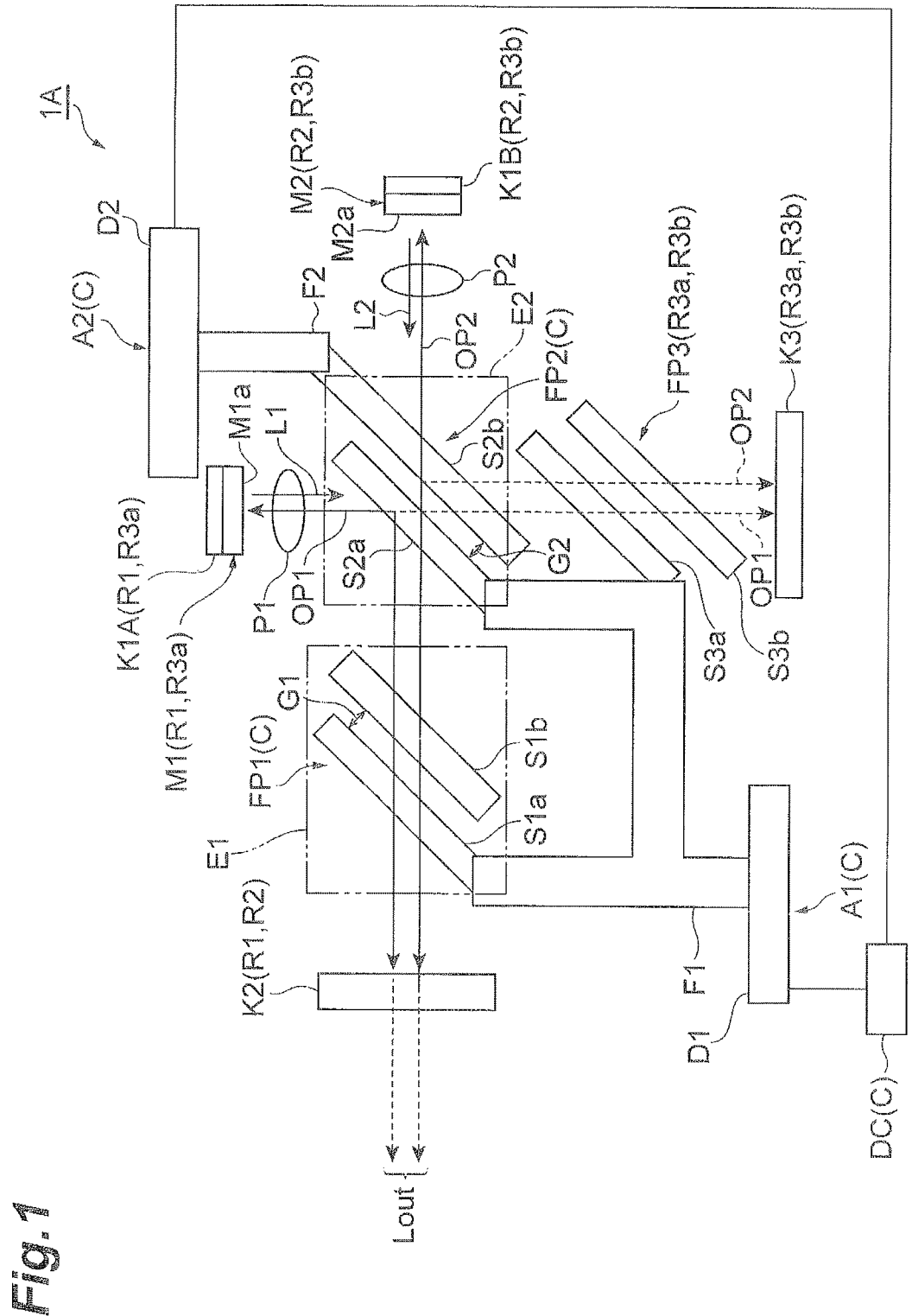
FIG. 1 is a diagram illustrating a basic configuration of a variable-wavelength light source of a first embodiment.

The basic configuration of the variable-wavelength light source will be described. As illustrated in FIG. 1, the variable-wavelength light source 1A is a laser oscillation type variable-wavelength light source. Emission light Lout emitted from the variable-wavelength light source 1A has a predetermined wavelength band BL (see FIG. 3) and a predetermined wavelength interval $\Delta\lambda$. The variable-wavelength light source 1A includes a first optical resonator R1, a second optical resonator R2, a third optical resonator R3, and an optical controller C.

The first optical resonator R1 emits first light L1 having a first wavelength band B1 (B1=$\lambda$1-1~$\lambda$1-2: see FIG. 3(a)). The first wavelength band B1 forms a part of a wavelength band BL of the emission light Lout (see FIG. 3). The first optical resonator R1 includes a first laser medium M1, a total reflection mirror (first total reflection mirror) K1A, and a half-mirror (first partial reflection mirror) K2. The first optical resonator R1 forms a first optical path OP1 of the first light L1. When a wavelength of the first light L1 reaching the total reflection mirror K1A after the first light L1 is reflected by the half-mirror K2 is within a gain band of the first laser medium M1, the first light L1 oscillates between the total reflection mirror K1A and the half-mirror K2. The emission light Lout is emitted from the half-mirror K2.

The first laser medium M1 emits and amplifies the first light L1 having the first wavelength band B1. The gain band of the first laser medium M1 is equivalent to a first wavelength band B1. The total reflection mirror K1A is arranged on an opposite side of a light-emitting surface M1$a$ of the first laser medium M1 on the first optical path OP1. The total reflection mirror K1A reflects the first light L1 of the first wavelength band B1. Reflectance of the total reflection mirror K1A is ideally 100% in the first wavelength band B1. Also, the reflectance of the total reflection mirror K1A need not necessarily be 100%. The total reflection mirror K1A is formed integrally with the first laser medium M1. Also, the total reflection mirror K1A may be arranged to be separated from a surface of a side opposite to the light-emitting surface M1$a$ of the first laser medium M1. In order to configure the first optical resonator R1, the variable-wavelength light source 1A has a Fabry-Perot interference filter as will be described later. The variable-wavelength light source 1A has the half-mirror K2 arranged on the first optical path OP1 to return the first light L1 to the first laser medium M1. The half-mirror K2 has lower reflectance than the total reflection mirror K1A in a wavelength band including the first wavelength band B1.

The second optical resonator R2 emits emission light Lout having the second wavelength band B2 ($\lambda$2-1~$\lambda$2-2: see FIG. 3(a)) that differs from the first optical resonator R1. The second wavelength band B2 forms a part of a wavelength band BL of the emission light Lout (see FIG. 3). The second optical resonator R2 includes a second laser medium M2, a total reflection mirror (second total reflection mirror) K1B, and a half-mirror (second partial reflection mirror) K2. The second optical resonator R2 forms a second optical path OP2 of the second light L2. When a wavelength of the second light L2 reaching the total reflection mirror K1B after the second light L2 is reflected by the half-mirror K2 is within a gain band of the second laser medium M2, the second light L2 oscillates between the total reflection mirror K1B and the half-mirror K2. The emission light Lout is emitted from the half-mirror K2.

The second laser medium M2 emits and amplifies the second light L2 having the second wavelength band B2. The gain band of the second laser medium M2 is equivalent to the second wavelength band B2. The total reflection mirror K1B is arranged on an opposite side of a light-emitting surface M2$a$ of the second laser medium M2 on the second optical path OP2. The total reflection mirror K1B reflects the second light L2 of the second wavelength band B2.

Figure 2:
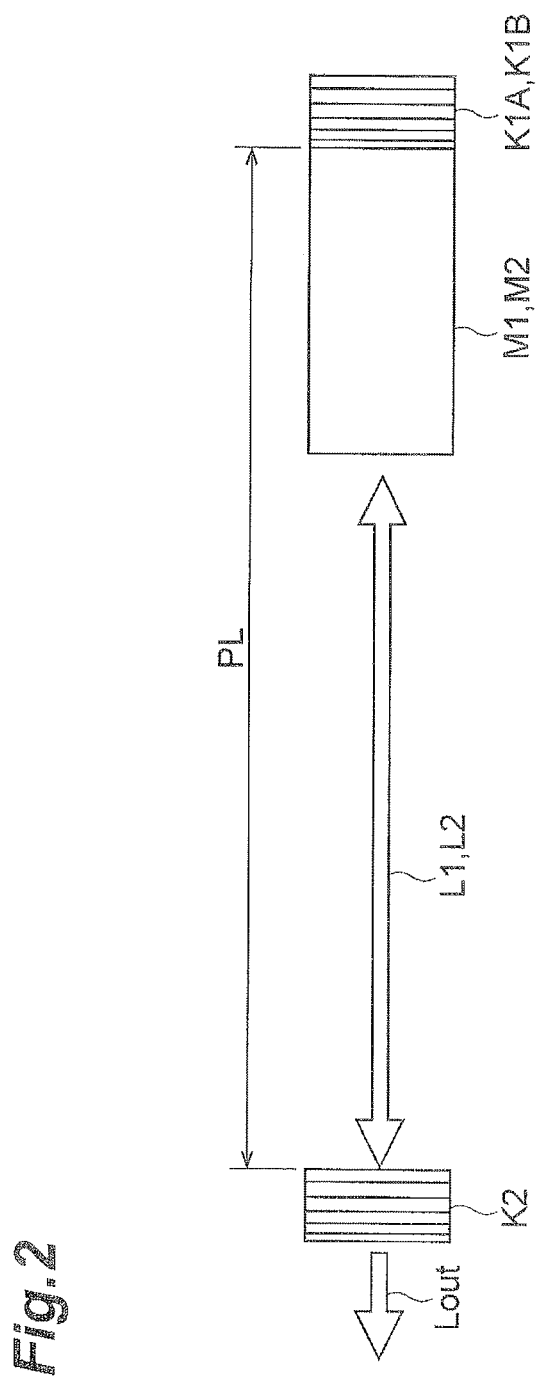
FIG. 2 is a diagram illustrating a basic configuration of an optical resonator in the variable-wavelength light source of FIG. 1.

As illustrated in FIG. 2, an optical path length PL from the total reflection mirror K1A to the half-mirror K2 and an optical path length PL from the total reflection mirror K1B to the half-mirror K2 are set to a distance which is an integer multiple or more of a wavelength within a range of a wavelength interval $\Delta\lambda$. For example, when a center wavelength $\lambda$c of the wavelength band BL of the emission light Lout is 1 μm and the wavelength interval $\Delta\lambda$ is 0.1 nm, the optical path length PL is set to 10 mm or more because oscillation is possible even when the wavelength of light is 0.9999 μm.

The relationships among the wavelength band BL of the emission light Lout, the first wavelength band B1 of the first light L1, and the second wavelength band B2 of the second light L2 will be described. As illustrated in FIG. 3, the first wavelength band B1 and the second wavelength band B2 are different from each other. For example, the first wavelength band B1 is a short wavelength side band ($\lambda$1-1~$\lambda$1-2). The second wavelength band B2 is a long wavelength side band ($\lambda$2-1~$\lambda$2-2). A longest wavelength ($\lambda$1-2) of the first wavelength band B1 is equal to a shortest wavelength ($\lambda$2-1) of the second wavelength band B2 (see FIG. 3(a)). Also, the longest wavelength ($\lambda$1-2) of the first wavelength band B1 may be longer than the shortest wavelength ($\lambda$2-1) of the second wavelength band B2 (see FIG. 3(b)). The first wavelength band B1 and the second wavelength band B2 may overlap in a partial band. The wavelength band BL of the emission light Lout is a band in which the first wavelength band B1 and the second wavelength band B2 are integrated. This band ($\lambda$1-1~$\lambda$2-2) is a band from the shortest wavelength ($\lambda$1-1) of the first wavelength band B1 to the longest wavelength ($\lambda$2-2) of the second wavelength band B2.

As illustrated in FIG. 1, the optical controller C has a first Fabry-Perot interference filter FP1 (hereinafter referred to as a "first filter FP1"), a second Fabry-Perot interference filter FP2 (hereinafter referred to as a "second filter FP2"), a first drive mechanism A1, a second drive mechanism A2, and a drive control unit (control unit) DC. The first Fabry-Perot interference filter FP1 sweeps a wavelength of the emission light Lout. The second Fabry-Perot interference filter FP2 selectively reflects or transmits the first light L1 of the first laser medium M1 and the second light L2 of the second laser medium M2 and guides the reflected or transmitted light to the first filter FP1. The first drive mechanism A1 controls a transmission wavelength λp1 of the first filter FP1. The second drive mechanism A2 controls a transmission wavelength λp2 of the second filter FP2. The drive control unit DC controls the first drive mechanism A1 and the second drive mechanism A2.

The first filter FP1 guides the first light L1 and the second light L2 to the half-mirror K2 and has a function of selectively transmitting and reflecting light of a specific wavelength included in the first light L1 and the second light L2. A Fabry-Perot type wavelength selecting filter has a configuration in which two mirrors are arranged in parallel. The mirrors are Bragg mirrors having films of different diffractive indices which are alternately arranged. The first filter FP1 has a pair of first mirrors S1a and S1b. The transmission wavelength λp1 of the first filter FP1 is defined by a first gap G1 between the first mirror S1a and the first mirror S1b. The relation between the transmission wavelength λp1 of the first filter FP1 and the first gap G1 is $\lambda p1 = 2 \times G1/m$. m is any integer.

The first filter FP1 is arranged at a first position E1. The first position E1 is a position between the first laser medium M1 and the half-mirror K2 on the first optical path OP1 and is a position between the second laser medium M2 and the half-mirror K2 on the second optical path OP2. The first filter FP1 is arranged to be tilted toward the first optical path OP1 and the second optical path OP2 so that reflected light is not returned to the first laser medium M1 and the second laser medium M2. It is only necessary to deviate each of an angle formed by the first optical path OP1 and the first filter FP1 and an angle formed by the second optical path OP2 and the first filter FP1 from 90 degrees. The angle, for example, is 45 degrees.

The second filter FP2 guides the first light L1 and the second light L2 to the first filter FP1 and has a function of selectively transmitting and reflecting light of a specific wavelength included in the first light L1 and the second light L2. The second filter FP2 has a pair of second mirrors S2a and S2b. The transmission wavelength λp2 of the second filter FP2 is defined by a second gap G2 between the second mirror S2a and the second mirror S2b. The relation between the transmission wavelength λp2 of the second filter FP2 and the second gap G2 is $\lambda p2 = 2 \times G2/m$. m is any integer.

The second filter FP2 is arranged at a second position E2. The second position E2 is a position between the first laser medium M1 and the first filter FP1 on the first optical path OP1 and is a position between the second laser medium M2 and the first filter FP1 on the second optical path OP2. The second filter FP2 is arranged to be tilted in a direction to the second optical path OP2 so that reflected light is not returned to the second laser medium M2. It is only necessary to deviate an angle formed by the second optical path OP2 and the second filter FP2 from 90 degrees. The angle, for example, is 45 degrees.

The lens (first optical component) P1 is arranged between the first laser medium M1 and the second filter FP2 on the first optical path OP1. The lens (second optical component) P2 is arranged between the second laser medium M2 and the second filter FP2 on the second optical path OP2.

The first drive mechanism A1 operates the first mirror S1a of the first filter FP1 and the second mirror S2a of the second filter FP2 in conjunction with each other. The first drive mechanism A1 has a frame F1 and a drive source D1. The frame F1 has two mirror connection ends and one drive source connection end. The first mirror S1a and the second mirror S2a are connected to the mirror connection end. The drive source D1 is connected to the drive source connection end. The first drive mechanism A1 operates the first mirror S1a and the second mirror S2a so that the first gap G1 of the first filter FP1 and the second gap G2 of the second filter FP2 periodically change. Because only the first gap G1 and the second gap G2 need to change, a direction in which the first mirror S1a and the second mirror S2a are operated is not considered. The first mirror S1a and the second mirror S2a may be operated in a direction in which the first optical path OP1 and the second optical path OP2 are orthogonal or may be operated in a direction along the first optical path OP1 and the second optical path OP2.

The second drive mechanism A2 operates the other second mirror S2b of the second filter FP2. The second drive mechanism A2 has a frame F2 and a drive source D2. The second mirror S2b is connected to one end side of the frame F2. The drive source D2 is connected to the other end side of the frame F2. The second mirror S2b is switched to a first or second state. The first state is a state in which the second gap G2 is different from the first gap G1. The second state is a state in which the second gap G2 is equal to the first gap G1.

The drive control unit DC controls the first drive mechanism A1 and the second drive mechanism A2 and has a function of inputting control signals to the first drive mechanism A1 and the second drive mechanism A2. The drive control unit DC controls the transmission wavelength λp1 of the first filter FP1 by controlling the first drive mechanism A1. In addition, the drive control unit DC controls the transmission wavelength λp2 of the second filter FP2 by controlling the second drive mechanism A2. Hereinafter, specific control of the first filter FP1 and the second filter FP2 by the drive control unit DC will be described.

As illustrated in FIG. 4, the first oscillation state is a state in which the first laser medium M1 performs oscillation. The first oscillation state is a state in which light of a wavelength included in the first wavelength band B1 is transmitted through the first filter FP1 and reflected (not transmitted) by the second filter FP2. The first oscillation state is a state in which the gain band of the first laser medium M1 and the first wavelength band B1 overlap. In the first oscillation state, the transmission wavelength λp1 of the first filter FP1 is different from the transmission wavelength λp2 of the second filter FP2. The drive control unit DC controls the first gap G1 so that the first filter FP1 transmits light of the first wavelength band B1. The drive control unit DC controls the second gap G2 so that the transmission wavelength λp2 of the second filter FP2 is different from the transmission wavelength λp1 of the first filter FP1. Specifically, the drive control unit DC controls the position of the second mirror S2b.

As illustrated in FIG. 5(a), in the first oscillation state, the first optical resonator R1 is formed of the first laser medium M1, the total reflection mirror K1A, and the half-mirror K2. In order to cause the first laser medium M1 to perform oscillation, the transmission wavelength λp1 of the first filter FP1 needs to be included in the gain band of the first laser medium M1. The gain band of the first laser medium M1 is the first wavelength band B1 (λ1-1~λ1-2). The transmission wavelength λp2 of the second filter FP2 is set to a different value from the transmission wavelength λp1. That is, the transmission wavelength band of the first filter FP1 is different from that of the second filter FP2. Through this setting, light of the transmission wavelength λp1 is necessarily reflected by the second filter FP2. Accordingly, the light of the transmission wavelength λp1 included in the first light L1 is reflected by the second filter FP2 and transmitted by the first filter FP1 and reaches the half-mirror K2. The light of the transmission wavelength λp1 is reflected by the half-mirror K2 and reaches the total reflection mirror K1A along a reverse path. Therefore, the first optical resonator R1 is formed between the total reflection mirror K1A and the half-mirror K2. The first laser medium M1 performs oscillation and emission light Lout of the transmission wavelength λp1 is emitted. Also, in the first oscillation state, the second light L2 of the second laser medium M2 is partially or totally reflected by the second filter FP2.

As illustrated in FIG. 4, the second oscillation state is a state in which the second laser medium M2 performs oscillation. The second oscillation state is a state in which light of the wavelength included in the second wavelength band B2 is transmitted through the first filter FP1 and the second filter FP2. The second oscillation state is a state in which the gain band of the second laser medium M2 and the second wavelength band B2 overlap. In the second oscillation state, the transmission wavelength λp2 of the second filter FP2 is equal to the transmission wavelength λp1 of the first filter FP1. The drive control unit DC controls the first gap G1 so that the first filter FP1 transmits light of the wavelength included in the second wavelength band B2. The drive control unit DC controls the second gap G2 so that the transmission wavelength λp2 of the second filter FP2 is equal to the transmission wavelength λp1 of the first filter FP1. Specifically, the drive control unit DC controls the position of the second mirror S2b.

As illustrated in FIG. 5(b), in the second oscillation state, the second optical resonator R2 is formed of the second laser medium M2, the total reflection mirror K1B, and the half-mirror K2. In order to cause the second laser medium M2 to perform oscillation, the transmission wavelength λp1 of the first filter FP1 needs to be included in the gain band of the second laser medium M2. The gain band is the second wavelength band B2 (λ2-1~λ2-2). The transmission wavelength λp2 of the second filter FP2 is set to a value equal to the transmission wavelength λp1. That is, the transmission wavelength band of the first filter FP1 and the transmission wavelength band of the second filter FP2 are equal to each other. According to this setting, the second light L2 of the transmission wavelength λp1 is transmitted through the second filter FP2 and the first filter FP1. Accordingly, the light of the transmission wavelength λp1 included in the second light L2 is transmitted through the second filter FP2 and transmitted through the first filter FP1 and reaches the half-mirror K2. The light of the transmission wavelength λp1 is reflected by the half-mirror K2 and reaches the total reflection mirror K1B along a reverse path. Therefore, the second optical resonator R2 is formed between the total reflection mirror K1B and the half-mirror K2. The second laser medium M2 performs oscillation and emission light Lout of the transmission wavelength λp1 is emitted.

In the second state, the first drive mechanism A1 and the second drive mechanism A2 are operated in cooperation with each other so that the second gap G2 of the second filter FP2 is equal to the first gap of the first filter FP1. The first light L1 of the first laser medium M1 is totally reflected by the first filter FP1 after a part or all of the light of the second wavelength band B2 is reflected by the second filter FP2.

As illustrated in FIG. 4, a first non-oscillation state and a second non-oscillation state are also obtained through a combination of the first wavelength band B1 of the first filter FP1 and the second wavelength band B2 of the second filter FP2. The first non-oscillation state is a state in which the first filter FP1 transmits the light of the wavelength included in the second wavelength band B2 and the second filter FP2 reflects the light of the wavelength included in the second wavelength band B2. However, the first non-oscillation state is a state in which the gain band of the first laser medium M1 does not overlap the second wavelength band B2. Accordingly, in the first non-oscillation state, the first laser medium M1 does not perform the oscillation. The second non-oscillation state is a state in which the first filter FP1 transmits light of the wavelength included in the first wavelength band B1 and the second filter FP2 transmits the light of the wavelength included in the first wavelength band B1. However, the second non-oscillation state is a state in which the gain band of the second laser medium M2 and the first wavelength band B1 do not overlap. Accordingly, in the second non-oscillation state, the second laser medium M2 does not perform oscillation. The drive control unit DC does not control the transmission wavelength λp1 of the first filter FP1 and the transmission wavelength λp2 of the second filter FP2 in these states.

Figure 6:
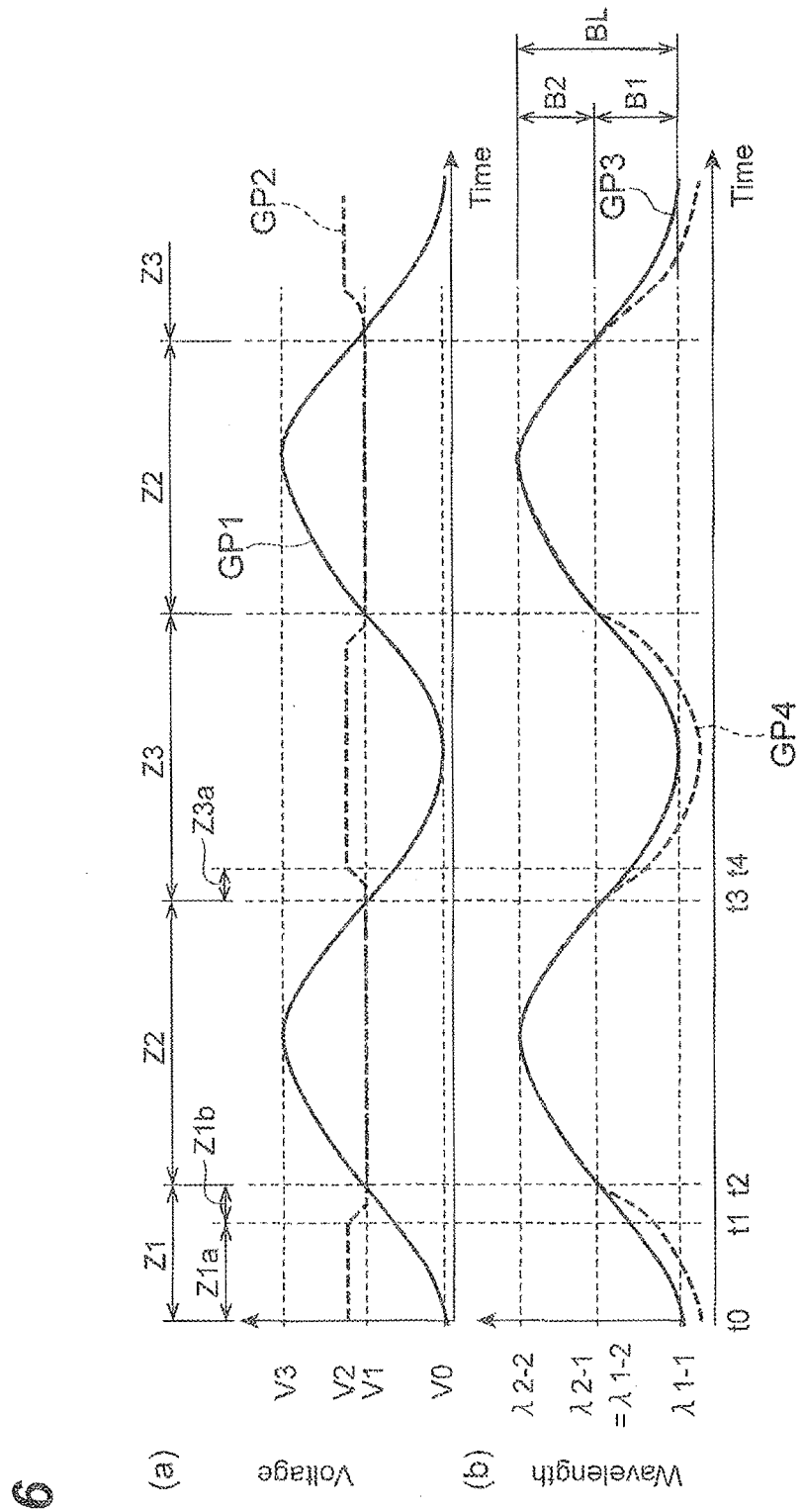
FIG. 6(a) is a graph illustrating temporal changes in control signals input to first and second drive mechanisms of the variable-wavelength light source of FIG. 1
FIG. 6(b) is a graph illustrating temporal changes in transmission wavelengths of the first and second Fabry-Perot interference filters.

FIG. 6(a) illustrates temporal changes in control signals input from the drive control unit DC to the first drive mechanism A1 and the second drive mechanism A2. The vertical axis represents a voltage of a control signal. The horizontal axis represents time. A graph GP1 (solid line) indicates the control signal input to the first drive mechanism A1. A graph GP2 (broken line) indicates the control signal input to the second drive mechanism A2. FIG. 6(b) illustrates temporal changes in the transmission wavelength λp1 of the first filter FP1 and the transmission wavelength λp2 of the second filter FP2. The vertical axis represents a transmission wavelength. The horizontal axis represents time. A graph GP3 (solid line) represents the transmission wavelength λp1 of the first filter FP1. A graph GP4 (broken line) represents the transmission wavelength λp2 of the second filter FP2.

As illustrated in FIGS. 6(a) and 6(b), the amplitude (graph GP3) of the transmission wavelength λp1 of the first filter FP1 includes the first wavelength band B1 of the first light L1 of the first laser medium M1 and the second wavelength band B2 of the second light L2 of the second laser medium M2. This wavelength band corresponds to the wavelength band BL of the emission light Lout emitted from the variable-wavelength light source 1A (see FIG. 3). The transmission wavelength λp1 of the first filter FP1 is controlled by the control signal (graph GP1) input to the first drive mechanism A1. The control signal input to the first drive mechanism A1 corresponds to a wavelength sweeping speed of the emission light Lout emitted from the variable-wavelength light source 1A. The operation control of the first drive mechanism A1 may be an operation at a relatively low speed according to a voltage of the control signal. The operation control of the first drive mechanism A1 may be a relatively high speed resonance operation to be implemented by applying a control signal of a frequency matching the resonance frequency of the first drive mechanism A1.

The drive control unit DC inputs sine-wave-shaped control signals (V0~V1) to the first drive mechanism A1 in a period Z1 (t0~t2). The drive control unit DC inputs a control signal (V2) to the second drive mechanism A2 in a period Z1a (t0~t1) included in the period Z1 (t0~t2) (see FIG. 6(a)).

In the first filter FP1, the one first mirror S1a is separated from the other first mirror S1b which is fixed and the transmission wavelength λp1 of the first filter FP1 changes from λ1-1 to λ1-2. That is, the transmission wavelength λp1 of the first filter FP1 gradually increases. In the second filter FP2, the other second mirror S2b moves to a position corresponding to the control signal (V2) and is in the first state. The one second mirror S2a reciprocates with respect to the other second mirror S2b in the first state. The operation of the second mirror S2a is synchronized with the operation of the first mirror S1a of the first filter FP1. However, the second gap G2 of the second filter FP2 is not equal to the first gap G1 of the first filter FP1. Accordingly, the transmission wavelength λp2 of the second filter FP2 changes to have a value different from the transmission wavelength λp1 of the first filter FP1. That is, as illustrated in the period Z1 of FIG. 6(b), the graph GP3 and the graph GP4 do not overlap. Therefore, in the period Z1, the first oscillation state is implemented.

Next, the drive control unit DC inputs sine-wave-shaped control signals (V1~V3~V1) to the first drive mechanism A1 in a period Z2 (t2~t3). The drive control unit DC inputs the control signal (V1) to the second drive mechanism A2.

In the first filter FP1, the one first mirror S1a reciprocates so that the one first mirror S1a is close to the other first mirror S1b which is fixed after being separated from the other first mirror S1b. Accordingly, the transmission wavelength λp1 of the first filter FP1 changes from λ1-2 (=λ2-1) to λ2-2 and then changes to λ1-2 again. In the second filter FP2, the other second mirror S2b moves to a position corresponding to the control signal (V1) and is in the second state. The one second mirror S2a reciprocates with respect to the other second mirror S2b in the second state. The operation of the second mirror S2a is in synchronization with the operation of the first mirror S1a of the first filter FP1. The second gap G2 of the second filter FP2 is equal to the first gap G1 of the first filter FP1. Accordingly, the transmission wavelength λp2 of the second filter FP2 changes to have a value equal to the transmission wavelength λp1 of the first filter FP1. That is, as illustrated in the period Z2 of FIG. 6(b), the graph GP3 and the graph GP4 overlap. Therefore, in the period Z2, the second oscillation state is implemented.

Next, the drive control unit DC inputs sine-wave-shaped control signals (V1~V0~V1) to the first drive mechanism A1 in a period Z3. The drive control unit DC inputs the control signal (V2) to the second drive mechanism A2. According to these control signals, as in the period Z1, the first oscillation state is implemented.

As described above, the emission light Lout is emitted from the variable-wavelength light source 1A by alternately iterating the period 72 in the first oscillation state and the period Z3 in the second oscillation state.

The drive control unit DC sets the control signal to be input to the second drive mechanism A2 as a constant voltage control signal (V2) in a period Z1a (t0~t1) included in the period Z1 and sets the control signal to be input to the second drive mechanism A2 as control signals (V2~V1) for gradually changing the magnitude of the voltage in the next period Z1b (t1~t2).

When the constant voltage control signal (V1) is input to the second drive mechanism A2, the transmission wavelength λp2 of the second filter FP2 is completely equal to the transmission wavelength λp1 of the first filter FP1. On the other hand, when the control signal to be input to the second drive mechanism A2 is a signal other than V1, a slightly deviated state is reached. In the second oscillation state in which the second laser medium M2 performs oscillation, the transmission wavelength λp2 of the second filter FP2 needs to be equal to the transmission wavelength λp1 of the first filter FP1. On the other hand, because it is only necessary for the transmission wavelength λp1 of the first filter FP1 and the transmission wavelength λp2 of the second filter FP2 to be different from each other in the first oscillation state in which the first laser medium M1 performs oscillation, the first laser medium M1 continuously performs oscillation at the transmission wavelength λp1 of the first filter FP1 even in the period Z1b (t1~t2) and a period Z3a (t3~t4). Accordingly, even when a predetermined time is required until the movement of the second drive mechanism A2 is completed after the control signal is input, the first oscillation state is maintained.

When a switching operation between the first state and the second state of the other second mirror S2b is performed at a high speed, the second drive mechanism A2 does not instantaneously stop and ringing or the like may occur even when the control signal is fixed to the constant voltage (V1 or V2) according to a resonance frequency component. However, the movement distance of the other second mirror S2b corresponds to a wavelength (for example, 1 nm) which is several times a filter half-value width of the Fabry-Perot interference filter. Accordingly, because the amplitude (voltage width) of the control signal is small and may be smoothly operated, it is possible to smoothly perform the oscillation switching of the first laser medium M1 and the second laser medium M2 without loss.

Ideally, the first gap G1 of the first filter FP1 changes in proportion to an operation position of the first drive mechanism A1 and the transmission wavelength λp1 of the first filter FP1 also linearly changes with respect to the first gap G1. However, when an electrostatic actuator or the like is used in the first drive mechanism A1, the operation position of the actuator is not linear with respect to the drive voltage. For example, in a comb-tooth type electrostatic actuator, the operation position is in proportion to a square of the drive voltage. In a parallel plate type electrostatic actuator, a relation between the operation position and the drive voltage is more complex. For the operation of the electrostatic actuator after voltage application, time delay according to an electrical time constant or a mechanical time constant of the actuator occurs. There is an individual error due to a manufacturing error as long as the first drive mechanism A1 and the second drive mechanism A2 are separate components. Therefore, data for calibrating the relation of the operation position and the drive voltage of each of the first filter FP1 and the second filter FP2 is acquired in advance. It is only necessary to perform an operation while correcting a relation between the operation position and the drive voltage using correction data.

Also, there is no relatively high speed processing in an electrical circuit if the drive frequency of each mirror is about several tens to several hundreds of Hz. Accordingly, it is possible to cooperatively operate the first filter FP1 and the second filter FP2 without correction.

In the configuration having the first optical resonator R1 and the second optical resonator R2, the light intensity of the emitted light Lout from the variable-wavelength light source 1A may be discontinuous at the time of switching from the first laser medium M1 to the second laser medium M2 or the time of switching from the second laser medium M2 to the first laser medium M1.

As one factor which causes discontinuity of the light intensity, there is a difference between gains of the first laser medium M1 and the second laser medium M2. Because the emitted light Lout is not emitted outside the half value width of the transmission wavelength λp1 of the first filter FP1, the emission light Lout having the wavelength within the half-value width is emitted. However, when the gain is different between the first laser medium M1 and the second laser medium M2, the light intensity of the emission light Lout may rapidly change. As a solution to this problem, there is a method of evaluating the gain of the first laser medium M1 and the gain of the second laser medium M2 in advance and adjusting each of an amount of electric current to be applied to the first laser medium M1 and an amount of electric current to be applied to the second laser medium M2 so that the gains averagely become the same gain.

Another factor which causes the discontinuity of the light intensity is considered. For example, in the first oscillation state in which the first laser medium M1 performs oscillation, the second laser medium M2 does not perform oscillation despite the fact that current injection is sustained. Therefore, in the first oscillation state, energy is stored within the second laser medium M2. Immediately after the oscillation from the first laser medium M1 to the second laser medium M2 is switched, that is, at the time of initial oscillation of the second laser medium M2, the stored energy is rapidly released and a high pulse of a peak value is generated. This phenomenon is the same as that of the principle of a so-called Q switch. When this pulse is generated, a saturation phenomenon of a detector side occurs in a measuring instrument using the variable-wavelength light source 1A and the measurement may be impeded.

As illustrated in FIG. 1, the variable-wavelength light source 1A includes a third optical resonator R3. The third optical resonator R3 prevents a pulse for causing the discontinuity of the light intensity from occurring. The third optical resonator R3 has two forms. A third optical resonator R3$a$ which is the first form has a first laser medium M1, a total reflection mirror K1A, a half-mirror K3, and a third Fabry-Perot interference filter FP3 (hereinafter referred to as a "third filter FP3"). A third optical resonator R3$b$ which is the second form has a second laser medium M2, a total reflection mirror K1B, a half-mirror K3, and a third filter FP3.

The third filter FP3 is a wavelength selecting filter having a similar configuration to the first filter FP1. The third filter FP3 is arranged on a first optical path OP1 in which light is transmitted through the second filter FP2 and a second optical path OP2 in which light is reflected by the second filter FP2. The third filter FP3 is arranged so that the second filter FP2 is positioned between the second laser medium M2 and the third filter FP3. The third filter FP3 has a pair of third mirrors S3$a$ and S3$b$. One third mirror S3$a$ of the third filter FP3 is connected to the first drive mechanism A1. Therefore, the third mirror S3$a$ operates in conjunction with the first mirror S1$a$ and the second mirror S2$a$. The other third mirror S3$b$ is fixed at a fixed position.

Also, another drive mechanism (not illustrated) may be attached to the other first mirror S1$b$ of the first filter FP1 or the other third mirror S3$b$ of the third filter FP3. An initial position of the first mirror S1$b$ or the third mirror S3$b$ is adjusted so that the third gap G3 of the third filter FP3 is equal to the first gap G1 of the first filter FP1. Through this configuration, it is possible to precisely synchronize the operations of the first filter FP1 and the third filter FP3 even when the first filter FP1 and the third filter FP3 are not configured to be exactly the same as each other due to a manufacturing error or the like.

The half-mirror K3 is arranged on the first optical path OP1 and the second optical path OP2. The third filter FP3 is arranged between the second filter FP2 and the half-mirror K3. The half-mirror K3 is a total reflection mirror or a half-mirror. It is only necessary for the half-mirror K3 to have reflectance sufficient for laser oscillation. It is possible to use a mirror using a material having a high refractive index such as silicon in the half-mirror K3. In the case of the mirror using silicon as the material having the high refractive index, it is suitable for the half-mirror K3 because it is possible to perform reflection of about 30% in Fresnel reflection of an end surface and wavelength dependency is substantially absent.

A pulse suppression operation by the third optical resonator R3 will be described. As illustrated in FIG. 3($b$), when the pulse is suppressed using the third optical resonator R3, the first wavelength band B1 of the first laser medium M1 and the second wavelength band B2 of the second laser medium M2 partially overlap. This is to smoothly perform wavelength switching. This redundant band BD ($\lambda$2-1~$\lambda$1-2) is in a state in which a gain is obtained in any of the first laser medium M1 and the second laser medium M2 (that is, a state in which oscillation is possible).

An operation in which the laser medium for oscillation is switched from the first laser medium M1 to the second laser medium M2 will be described. As illustrated in FIG. 7($a$), in the first oscillation state in which the first laser medium M1 performs oscillation, the second light L2 of the second laser medium M2 is reflected by the second filter FP2 and incident on the third filter FP3. When the transmission wavelength $\lambda$p1 of the first filter FP1 is also $\lambda$1-1~$\lambda$2-1 (a period W1 of FIG. 3($b$)), the transmission wavelength $\lambda$p3 of the third filter FP3 is also $\lambda$1-1~$\lambda$2-1. Because the second light L2 does not include light of the wavelength of $\lambda$1-1~$\lambda$2-1, all the second light L2 is reflected. Next, when the transmission wavelength $\lambda$p1 of the first filter FP1 changes to a wavelength (a period W2 of FIG. 3($b$)) within the redundant band BD, the transmission wavelength $\lambda$p3 of the third filter FP3 also becomes a wavelength (the period W2 of FIG. 3($b$)) within the redundant band BD. Then, the light of the transmission wavelength $\lambda$p1 included in the second light L2 is transmitted through the third filter FP3 and reflected by the half-mirror K3, and reaches the total reflection mirror K1B along a reverse path. Therefore, an optical path between the total reflection mirror K1B and the half-mirror K3 is formed. Furthermore, because the transmission wavelength $\lambda$p1 is within a gain band of the second laser medium M2, energy stored in the second laser medium M2 in which the third optical resonator R3$b$ is formed is released.

An operation in which the laser medium for oscillation is switched from the second laser medium M2 to the first laser medium M1 will be described. As illustrated in FIG. 7($b$), in the second oscillation state in which the second laser medium M2 performs oscillation, the first light L1 of the first laser medium M1 is reflected by the second filter FP2. When the transmission wavelength $\lambda$p1 of the first filter FP1 is $\lambda$1-2~$\lambda$2-2 (a period W3 of FIG. 3($b$)), the transmission wavelength $\lambda$p2 of the second filter FP2 is also $\lambda$1-2~$\lambda$2-2. Because the first light L1 does not include light of the wavelength of $\lambda$1-2~$\lambda$2-2, all the first light L1 is reflected. Next, when the transmission wavelength $\lambda$p1 of the first filter FP1 changes to a wavelength within the redundant band BD (the period W2 of FIG. 3($b$)), light of the transmission wavelength $\lambda$p1 in the first light L1 is reflected by the half-mirror K3 after being transmitted through the second filter FP2 and the third filter FP3 and reaches the total reflection mirror K1A along a reverse path. Therefore, an optical path is formed between the total reflection mirror K1A and the half-mirror K3. Furthermore, because the transmission wavelength $\lambda$p1 is within a gain band of the first laser medium M1, energy stored in the first laser medium M1 in which the third optical resonator R3$a$ is formed is released.

As described above, shortly before the laser medium is switched, that is, in the overlapping redundant band BD, oscillation starts even in the laser medium of a non-oscillation side. The oscillating light is not extracted to an emission side even when a high pulse of a peak value oscillates in oscillation in the third optical resonator R3a and the third optical resonator R3b.

Hereinafter, an operation and effect of the variable-wavelength light source 1A will be described.

In order to cause a semiconductor laser element for use in the variable-wavelength light source to perform laser oscillation, it is necessary to form a level at which electrons directly transition within the laser medium. In order to cause the semiconductor laser element to efficiently perform oscillation, crystal growth is performed so that the number of levels provided in the laser medium is small. On the other hand, because an oscillation wavelength is limited for the laser medium having a small number of levels, it is not proper as the laser medium for use in the variable-wavelength light source. Therefore, the laser medium for the variable-wavelength light source is manufactured through crystal growth in which the number of levels within the crystal increases due to an increase in impurities or the like. When the number of crystal defects increases according to this crystal growth, it is difficult to increase an oscillation width without limitation. Therefore, there is a limitation on a method of extending a variable-wavelength width in a single laser medium.

When a variable-wavelength band is narrow in spectral analysis, it is necessary to prepare a plurality of light sources because it is difficult to cover all wavelength bands to be analyzed. For example, the variable-wavelength width determines the resolution in optical coherence tomography (OCT). Therefore, in the OCT, the resolution is higher when the variable-wavelength band is wider. When a plurality of light sources having different center wavelengths are used, light emitted from the plurality of light sources is multiplexed according to a method of switching or the like of an optical coupler or a shutter. For example, when the light is emitted from one single-mode optical filter as in the OCT or the like, light is multiplexed by a fiber coupler or the like. In this case, a power loss of 50% occurs in principle.

When the variable-wavelength light source is configured to be applied to various measurement apparatuses as described above, it is necessary to extend a variable-wavelength range in any method and variable-wavelength light sources capable of inexpensively and efficiently extending the variable-wavelength range are being investigated.

The variable-wavelength light source 1A includes the first laser medium M1 and the second laser medium M2 configured to amplify light having different wavelength bands. The wavelength band BL of the emission light Lout of the variable-wavelength light source 1A is a combination of the first wavelength band B1 of the first light L1 amplified by the first laser medium M1 and the second wavelength band B2 of the second light L2 amplified by the second laser medium M2. Accordingly, the first laser medium M1 and the second laser medium M2 configured to amplify the light having the different wavelength bands are provided, so that it is possible to extend the wavelength band BL of the emission light Lout. The first drive mechanism A1 operates one first mirror S1a and one second mirror S2a in conjunction with each other and the second drive mechanism A2 drives the other second mirror S2b. Through this configuration, the transmission wavelength $\lambda p1$ of the first filter FP1 and the transmission wavelength $\lambda p2$ of the second filter FP2 can be identical or different. According to a combination of the transmission wavelength $\lambda p1$ of the first filter FP1 and the transmission wavelength $\lambda p2$ of the second filter FP2, the first optical resonator R1 configured to cause the first light L1 of the first laser medium M1 to optically resonate and the second optical resonator R2 configured to cause the second light L2 of the second laser medium M2 to optically resonate are selectively configured. Thus, while operation states of the first laser medium M1 and the second laser medium M2 are constantly maintained, it is possible to switch the first laser medium M1 and the second laser medium M2 to cause oscillation. Therefore, the variable-wavelength light source 1A can stabilize optical characteristics of the emission light Lout and extend the wavelength band BL of the emission light Lout.

The variable-wavelength light source 1A can periodically change the wavelength band BL of the emission light Lout of the variable-wavelength light source 1A because the transmission wavelength $\lambda p1$ of the first filter FP1 and the transmission wavelength $\lambda p2$ of the second filter FP2 periodically change.

The first mirror S1a and the second mirror S2a of the variable-wavelength light source 1A operate at a resonance frequency of the first drive mechanism A1. Therefore, energy necessary to drive the first mirror S1a and the second mirror S2a at predetermined amplitude is suppressed and it is possible to drive the first mirror S1a and the second mirror S2a with high efficiency at a high frequency.

Through control to be performed by the drive control unit DC of the variable-wavelength light source 1A, it is possible to cause the transmission wavelength $\lambda p2$ of the second filter FP2 to be different from the transmission wavelength $\lambda p1$ of the first filter FP1 in a first state in which the second gap G2 is different from the first gap G1. On the other hand, in a second state in which the second gap G2 is equal to the first gap G1, it is possible to cause the transmission wavelength $\lambda p2$ of the second filter FP2 to be equal to the transmission wavelength $\lambda p1$ of the first filter FP1.

The variable-wavelength light source 1A includes a lens P1 and a lens P2. Therefore, it is possible to efficiently use the first light L1 amplified by the first laser medium M1 and the second light L2 amplified by the second laser medium M2.

A size of the variable-wavelength light source 1A can be reduced more than that of a light source based on coupling of an optical coupler or the like and a highly efficient operation can be implemented at a high speed.

The variable-wavelength light source 1A can cause the first laser medium M1 and the second laser medium M2 to be constantly in a current application state. Therefore, it is possible to operate the first laser medium M1 and the second laser medium M2 in a thermally stable operation state. Further, the emission light Lout is emitted from the half-mirror K2 on the same optical path. Therefore, the optical design of a subsequent stage to be coupled to the optical fiber is facilitated.

The variable-wavelength light source 1A is a laser oscillation type light source for causing the first optical resonator R1 to oscillate the first light L1 and causing the second optical resonator R2 to oscillate the second light L2. Here, an operation and effect of the variable-wavelength light source 1A will be further described with a comparison between a spectroscopic apparatus having the variable-wavelength light source 1A which is a laser oscillation type and a spectroscopic apparatus having a white light source such as a halogen lamp.

In the spectroscopic apparatus having the white light source, light emitted from the white light source is radiated to a sample and reflected light or transmitted light is guided to a spectroscope. An optical spot size is limited using a slit for improving the resolution in an optical incident port of the spectroscope. Through the limit of the spot size, light including a signal component is lost. Light passing through the slit is dispersed by a diffraction grating and detected as a wavelength-specific signal in each pixel of an image sensor. This signal is read by the signal read circuit. The read signal is subjected to data processing by a personal computer or the like and displayed as a spectrum image.

On the other hand, because the spectroscope or the image sensor is unnecessary in the spectroscopic apparatus having the variable-wavelength light source 1A, it is possible to configure an inexpensive detection unit in a small size. When spectrum information is obtained, the wavelength of the emission light Lout of the variable-wavelength light source 1A is scanned in synchronization with a control signal output from the personal computer or the like and wavelength-specific data is acquired. Also, because a wavelength scanner is necessary according to the spectroscopic apparatus having the variable-wavelength light source 1A, but substantially the same time even in the reading of pixel information in the image sensor of the spectroscope is required, there is no superiority related to a measurement time.

Further, because most injected energy is converted into light in the laser oscillation type variable-wavelength light source 1A, it is possible to obtain the emission light Lout having high power use efficiency and high luminance as compared with another scheme. The emission light Lout is coherent light of a Gaussian beam. The emission light Lout can be converted into relatively wide collimated light or focused on a small beam. Therefore, the variable-wavelength light source 1A can adopt a method of radiating light matching a sample according to the purpose of use.

When a wavelength resolution of 1 nm or less is implemented in the spectroscopic apparatus having a spectroscope, a slit width is narrowed and the light use efficiency is significantly degraded. On the other hand, the variable-wavelength light source 1A can easily implement a wavelength resolution of 1 nm or less basically because oscillation is laser oscillation.

Also, the second light L2 of the second laser medium M2 may be directly incident on the second filter FP2, but may be arranged to be emitted in the same direction as the first light L1 of the first laser medium M1 and arranged to be guided to the second filter FP2 using an optical component such as a total reflection mirror.

<Specific Configuration of Variable-Wavelength Light Source>

The specific configuration of the variable-wavelength light source 1A will be described. In manufacturing of the variable-wavelength light source 1A, surface micromachining which is MEMS technology is used. Through the surface micromachining, it is possible to manufacture the variable-wavelength light source 1A in a small size and at a low cost.

Figure 8:
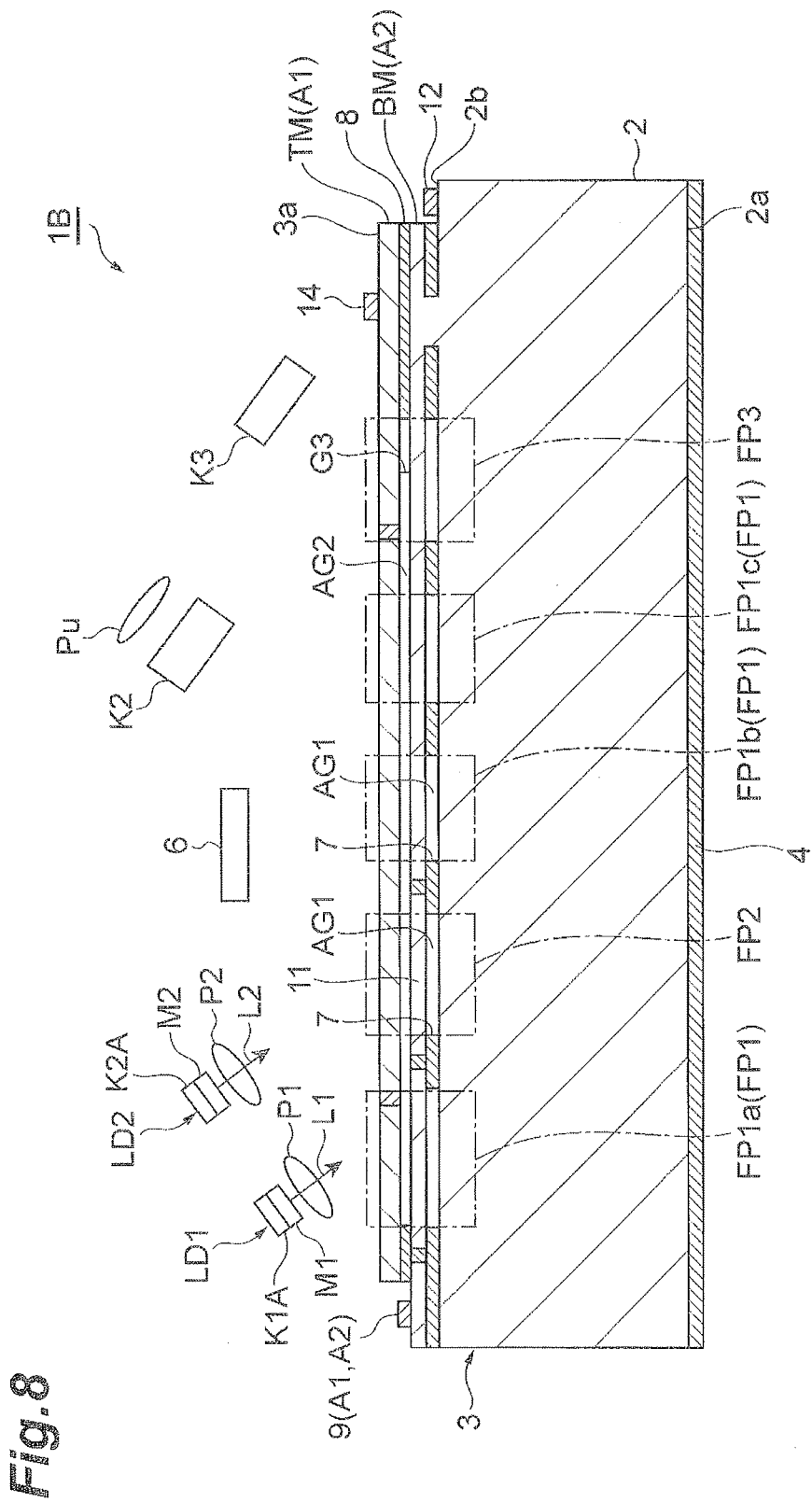
FIG. 8 is a cross-sectional view of a basic configuration related to the variable-wavelength light source of the first embodiment.

As illustrated in FIG. 8, the variable-wavelength light source 1B has an MEMS structure 3. This MEMS structure 3 is obtained by forming the first filter FP1, the second filter FP2, the third filter FP3, the first drive mechanism A1, and the second drive mechanism A2 in a silicon substrate (semiconductor substrate) 2. In a surface 2a of the silicon substrate 2, a total reflection mirror 4 formed of a metal film is formed. On the silicon substrate 2, a substrate electrode 12 is formed. On the MEMS structure 3, a laser diode LD1, a laser diode LD2, a lens P1, a lens P2, a total reflection mirror 6, a half-mirror K2, a half-mirror K3, and an output lens Pu are arranged.

The MEMS structure 3 includes a lower mirror layer BM and an upper mirror layer TM. The lower mirror layer BM is arranged to be separated upward from a surface 2b of the silicon substrate 2. The upper mirror layer TM is arranged to be separated upward from the lower mirror layer BM. The lower mirror layer BM and the upper mirror layer TM have a Bragg mirror structure for a Fabry-Perot type wavelength selecting filter. A plurality of support portions 7 for supporting the lower mirror layer BM are arranged between the silicon substrate 2 and the lower mirror layer BM. A plurality of air gaps AG1 are formed between the plurality of support portions 7. A support portion 8 for supporting the upper mirror layer TM is arranged between the lower mirror layer BM and the upper mirror layer TM. Air gaps AG2 are formed between a plurality of support portions 8. A configuration in which the upper mirror layer TM is formed on the lower mirror layer BM is a structure which forms a Fabry-Perot interference filter. The lower mirror layer BM and the upper mirror layer TM are divided into a plurality of Fabry-Perot interference filters by the support portions 7. Therefore, in the MEMS structure 3, a plurality of Fabry-Perot interference filters are arranged in a direction along the surface 2b of the silicon substrate 2.

Figure 9:
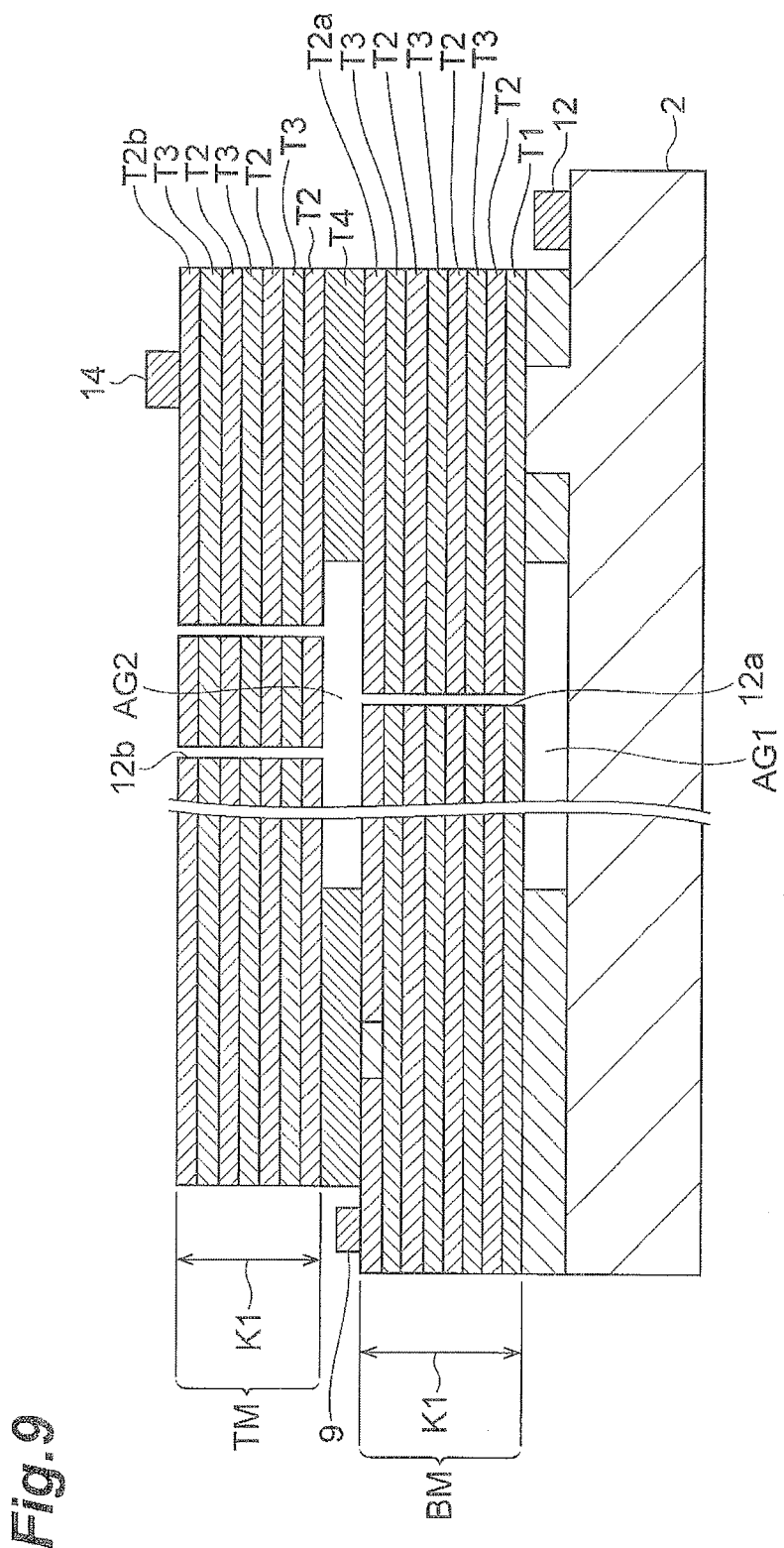
FIG. 9 is a cross-sectional view illustrating a main part of the variable-wavelength light source of FIG. 8.

As illustrated in FIG. 9, the lower mirror layer BM is formed on a silicon oxide film T1 of the silicon substrate 2. A thickness K1 of the lower mirror layer BM is set to ($\frac{1}{4} \times \lambda c/n$) with respect to a center wavelength $\lambda c$ of the wavelength band BL of the emission light Lout. n is a refractive index of each layer. The lower mirror layer BM has a structure in which polysilicon films T2 of four layers and silicon nitride films T3 of three layers are alternately stacked. A lower electrode 9 is electrically connected to a polysilicon film T2a which forms the surface of the lower mirror layer BM.

The lower mirror layer BM has an etching hole 12a for forming the air gap AG1. The height of the air gap AG1 below the second filter FP2 is set to ($\frac{1}{4}\lambda c$) with respect to the center wavelength $\lambda c$ of the emission light Lout to form a part of the lower mirror layer BM.

As illustrated in FIG. 10(a), the lower electrode 9 is provided in a left center of the polysilicon film T2a which forms the surface of the lower mirror layer BM. One end of a wiring pattern 11a is connected to the lower electrode 9. The other end of the wiring pattern 11a is connected to a circular movable portion 11. The movable portion 11 is surrounded by an insulating pattern 11b for electrically insulating the movable portion 11 from a surrounding region 13. The movable portion 11 is electrically insulated from the surrounding region 13. On the other hand, the movable portion 11 is physically integrated with the surrounding region 13.

As illustrated in FIG. 9, the upper mirror layer TM is formed on the lower mirror layer BM via the silicon oxide film T4 formed on the polysilicon film T2a. The upper mirror layer TM has a similar structure to the lower mirror layer BM. An upper electrode 14 is electrically connected to the polysilicon film T2b which forms the surface of the upper mirror layer TM. An etching hole 12b for forming the air gap AG2 is formed in the upper mirror layer TM.

As illustrated in FIG. 10(b), the upper mirror layer TM has a circular movable portion 17. The movable portion 17 is electrically insulated from a surrounding region 16 in which the upper electrode 14 is electrically connected. The movable portion 17 is surrounded by an insulating pattern 18 for electrically insulating the movable portion 17 from the surrounding region 16. The movable portion 17 is electrically insulated from the surrounding region 16, so that, when a voltage is applied to the lower electrode 9, it is possible to prevent the movable portion 17 of the upper mirror layer TM from moving due to pulling by an electrostatic force due to its potential difference. The movable portion 17 is electrically insulated from the surrounding region 16. On the other hand, the movable portion 17 is physically integrated with the surrounding region 16.

A specific example of reflection characteristics of the upper mirror layer TM and the lower mirror layer BM will be described with reference to FIG. 11(a). The horizontal axis of FIG. 11(a) represents a wavelength. The vertical axis represents reflectance. A graph GP5 (solid line) represents reflection characteristics of the upper mirror layer TM. A graph GP6 (broken line) represents reflection characteristics of the lower mirror layer BM. As can be seen from the graph GP5 and the graph GP6, the upper mirror layer TM and the lower mirror layer MB have a reflectance of 98% or more in the wavelength band BL (for example, 1.2 µm~1.4 µm) of the emission light Lout. According to the upper mirror layer TM and the lower mirror layer BM, it is possible to configure a Fabry-Perot interference filter for transmitting light of 98% or more in a variable-wavelength range of ±100 nm having a center wavelength of 1.3 µm.

The first filter FP1 and the second filter FP2 formed by the lower mirror layer BM and the upper mirror layer TM as illustrated in FIG. 8 will be described. The first filter FP1 is formed of the surrounding region 13 of the lower mirror layer BM and the upper mirror layer TM. The MEMS structure 3 has three first filters FP1a, FP1b, and FP1c which are equivalent to one another. The second filter FP2 is formed of the movable portion 11 of the lower mirror layer BM and the upper mirror layer TM.

The transmission wavelength $\lambda p1$ of the first filter FP1 and the transmission wavelength $\lambda p2$ of the second filter FP2 are determined by the air gap AG2. A relation between the transmission wavelength $\lambda p1$ and the air gap AG2 is AG2=½×$\lambda p1$. In addition, a relation between the transmission wavelength $\lambda p2$ and the air gap AG2 is AG2=½×$\lambda p2$. The air gap AG2 changes when the upper mirror layer TM moves toward or away from the lower mirror layer BM.

Specific examples of characteristics of the transmission wavelength $\lambda p1$ of the first filter FP1, characteristics of the transmission wavelength $\lambda p2$ of the second filter FP2, and characteristics of the transmission wavelength $\lambda p3$ of the third filter FP3 will be described with reference to FIG. 11(b). The first filter FP1, the second filter FP2, and the third filter FP3 are assumed to be formed of the upper mirror layer TM and the lower mirror layer BM having reflection characteristics illustrated in FIG. 11(a). The horizontal axis of FIG. 11(b) represents a transmission wavelength. The vertical axis represents transmittance. A graph GP7 represents wavelength characteristics when the air gap AG2 is 1.76 µm. A graph GP8 represents wavelength characteristics when the air gap AG2 is 1.9 µm. A graph GP9 represents wavelength characteristics when the air gap AG2 is 2.0 µm. A graph GP10 represents wavelength characteristics when the air gap AG2 is 2.13 µm. As can be seen from the graphs GP7, GP8, GP9, and GP10, it is only necessary to change the air gap AG2 between 1.76 µm and 2.13 µm to set transmission wavelength $\lambda p1$ of the first filter FP1, the transmission wavelength $\lambda p2$ of the second filter FP2, and the transmission wavelength $\lambda p3$ of the third filter FP3 to 1.2 µm~1.4 µm. As can be seen, a transmittance of 98% or more is obtained at a peak point at a transmission wavelength in any of the air gaps AG2.

The upper mirror layer TM is driven by an electrostatic force to be generated between the upper mirror layer TM and the lower mirror layer BM. For example, it is assumed that a control signal indicated by the graph GP1 of FIG. 6(a) is input to the upper electrode 14, a control signal indicated by the graph GP2 of FIG. 6(b) is input to the lower electrode 9, and a control signal of a reference potential (GND) is applied to the substrate electrode 12. At this time, a predetermined potential difference occurs between the upper mirror layer TM and the lower mirror layer BM and an electrostatic force corresponding to this potential difference is generated by the principle of a parallel plate capacitor. Accordingly, the transmission wavelength $\lambda p1$ of the first filter FP1, the transmission wavelength $\lambda p2$ of the second filter FP2, and the transmission wavelength $\lambda p3$ of the third filter FP3 periodically change. In the variable-wavelength light source 1B, the upper mirror layer TM corresponds to the first mirror S1a, the second mirror S2a, and the third mirror S3a. In addition, the upper mirror layer TM corresponds to a frame F1 and a drive source D1 of the first drive mechanism A1 for causing each mirror to operate. The lower mirror layer BM corresponds to the second mirror S2b. In addition, the lower mirror layer BM corresponds to a frame F2 and a drive source D2 of the second drive mechanism A2 for causing the second mirror S2b to operate.

When a voltage of a control signal input to the lower electrode 9 is different from a voltage of a control signal input to the substrate electrode 12, a potential difference occurs between the movable portion 11 of the lower mirror layer BM and the silicon substrate 2. Therefore, an electrostatic force is generated between the movable portion 11 of the lower mirror layer BM and the silicon substrate 2 and the air gap AG1 between the movable portion 11 of the lower mirror layer BM and the silicon substrate 2 changes. However, because a potential difference between the surrounding region 13 of the lower mirror layer BM and the silicon substrate 2 does not occur, the lower mirror layer BM does not operate. Therefore, this state is a first state in which the second gap G2 of the second filter FP2 is different from the first gap G1 of the first filter FP1. That is, when the voltage of the control signal input to the lower electrode 9 is different from the voltage of the control signal input to the substrate electrode 12, the second mirror S2b is in the first state.

On the other hand, when the voltage of the control signal input to the lower electrode 9 is equal to the voltage of the control signal input to the substrate electrode 12, that is, when the voltage of the control signal input to the lower electrode 9 is a ground potential GND, there is no electrostatic force because no potential difference occurs between the entire lower mirror layer BM and the silicon substrate 2. Thus, the lower mirror layer BM does not operate. In this state, the air gaps AG2 between the lower mirror layer BM and the upper mirror layer TM have the same width as each other without differing according to each position. Accordingly, the transmission wavelength $\lambda p2$ of the second filter FP2 is equal to the transmission wavelengths $\lambda p1$ of the first filters FP1a, FP1b, and FP1c and the transmission wavelength $\lambda p3$ of the third filter FP3. That is, when the voltage of the control signal input to the lower electrode 9 is equal to the voltage of the control signal input to the substrate electrode 12, the second mirror S2b is in the second state.

As illustrated in FIG. 8, the laser diode LD1 is obtained by integrating the first laser medium M1 and the total reflection mirror K1A. For example, a surface light-emitting element (vertical cavity surface emitting laser (VCSEL)) can be used in the laser diode LD1. The laser diode LD1 is arranged on the MEMS structure 3 so that an emission direction of the first light L1 is tilted toward the first filter FP1a. The lens P1 is arranged on the first optical path OP1 between the laser diode LD1 and the first filter FP1a.

The laser diode LD2 is obtained by integrating the second laser medium M2 and the total reflection mirror K1B. The laser diode LD2 is arranged on the MEMS structure 3 so that an emission direction of the second light L2 is tilted toward the second filter FP2. An angle formed by the emission direction of the second light L2 of the laser diode LD2 and the surface of the silicon substrate 2 is the same as an angle formed by the emission direction of the first light L1 of the laser diode LD1 and the surface 3a of the MEMS structure 3. The lens P2 is arranged on the second optical path OP2 between the laser diode LD2 and the second filter FP2.

The half-mirror K2 is for the first optical resonator R1 or the second optical resonator R2. The half-mirror K2 is arranged in a traveling direction of light transmitted through the first filter FP1b on the MEMS structure 3. The first light L1 or the second light L2 transmitted through the first filter FP1b is incident on the half-mirror K2. The output lens Pu for collimating the light transmitted through the half-mirror K2 is arranged in the traveling direction of the light transmitted through the half-mirror K2. The half-mirror K3 is for the third optical resonator R3. The half-mirror K3 is arranged in the traveling direction of the light transmitted through the third filter FP3 on the MEMS structure 3. The first light L1 or the second light L2 transmitted through the third filter FP3 is incident on the half-mirror K3.

Tilt angles of the half-mirror K2 and the half-mirror K3 formed with the surface 3a of the MEMS structure 3 become −90 degrees with respect to tilt angles of a light emission direction of the laser diode LD1 and the laser diode LD2 formed with the surface 3a of the MEMS structure 3. However, the tilt angles of the laser diode LD1 and the laser diode LD2 and the tilt angles of the half-mirror K2 and the half-mirror K3 are not essential. Each arrangement angle can be set to a desired angle other than 0 degrees (when light is incident to be perpendicular to the first filter FP1 and the second filter FP2). However, angular dependence of transmission wavelength characteristics of the first filter FP1 and the second filter FP2 may increase when the tilt angle increases. Therefore, it is preferable that the tilt angle be 45 degrees or less.

The laser diode LD1, the first filter FP1a, and the laser diode LD2 are arranged so that the first light L1 of the laser diode LD1 is not incident on the laser diode LD2 through reflection by the first filter FP1a.

The laser diode LD1, the first filter FP1a, and the total reflection mirror 6 are arranged so that the first light L1 of the laser diode LD1 is not incident on the total reflection mirror 6 through reflection by the first filter FP1a. Through this arrangement, the first light L1 is reflected by the first filter FP1a, so that it is possible to prevent an unintended optical resonator from being formed.

The half-mirror K2 and the half-mirror K3 are arranged to be separated from each other. Through this arrangement, the second light L2 of the laser diode LD2 reflected by the second filter FP2 is reflected by the total reflection mirror 6 and the first filter FP1c and travels between the half-mirror K2 and the half-mirror K3. Therefore, the second light L2 reflected by the first filter FP1c is incident on the laser diode LD2 along a reverse path, so that it is possible to prevent an unintended optical resonator from being formed.

The total reflection mirror 6 is arranged between the laser diode LD2 and the half-mirror K2 so that the total reflection mirror 6 is parallel to the surface 3a. The first light L1 transmitted through the second filter FP2 or the second light L2 reflected by the second filter FP2 is incident on the total reflection mirror 6. The total reflection mirror 6 reflects the first light L1 and the second light L2 to the first filter FP1c.

The total reflection mirror 4 is made of a metal film and is formed in the rear surface 2a of the silicon substrate 2. The first light L1 transmitted through the first filter FP1a is incident on the total reflection mirror 4 and reflected toward the second filter FP2. The first light L1 reflected by the second filter FP2 is incident on the total reflection mirror 4. The total reflection mirror 4 reflects the first light L1 toward the first filter FP1b. The second light L2 transmitted through the second filter FP2 is incident on the total reflection mirror 4. The total reflection mirror 4 reflects the second light L2 toward the first filter FP1b. The first light L1 or the second light L2 transmitted through the first filter FP1c after being reflected by the total reflection mirror 6 is incident on the total reflection mirror 4. The total reflection mirror 4 reflects the first light L1 or the second light L2 in the direction of the first filter FP1d.

Figure 12:
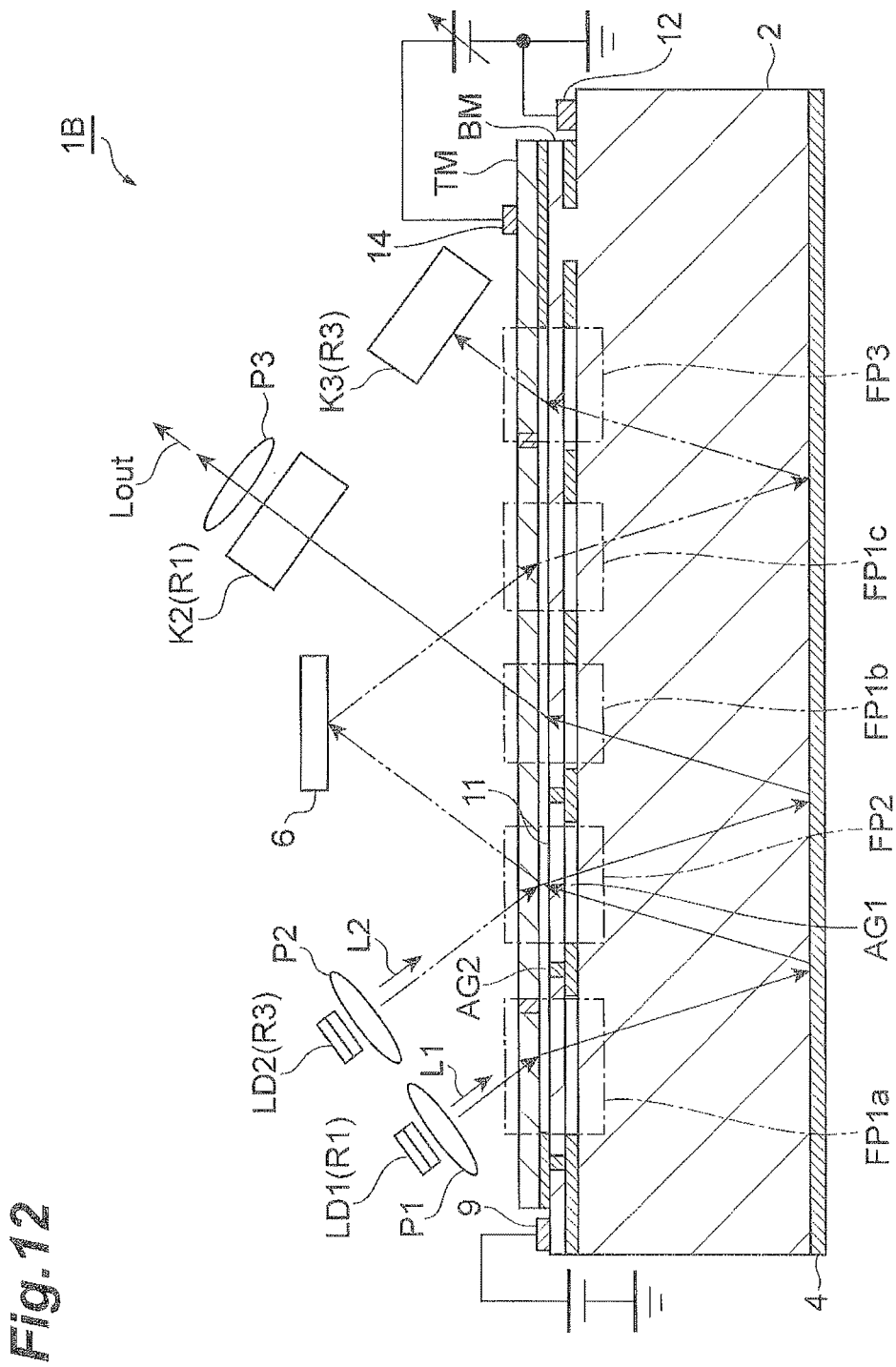
FIG. 12 is a diagram illustrating a first oscillation state in the variable-wavelength light source of FIG. 8.

An operation of a variable-wavelength light source 1B will be described. In the periods Z1 and Z3 (see FIG. 6(a)) in the first oscillation state (see FIG. 4), a control signal (the graph GP1 of FIG. 6(a)) is input to the upper electrode 14, a control signal (the graph GP2 of FIG. 6(a)) is input to the lower electrode 9, and the substrate electrode 12 is connected to a ground potential GND. As illustrated in FIG. 12, the movable portion 11 of the lower mirror layer BM (see FIG. 10(a)) is pulled to the side of the silicon substrate 2 because the potential of the silicon substrate 2 is GND and the air gap AG2 with the upper mirror layer TM is extended. That is, the air gap AG2 of the first filter FP1a, the first filter FP1b, and the first filter FP1c is different from the air gap AG2 of the second filter FP2. The transmission wavelength λp2 of the second filter FP2 is different from the transmission wavelengths λp1 of the first filter FP1a, the first filter FP1b, the first filter FP1c, and the first filter FP1d. Therefore, the light transmitted by the first filter FP1 is reflected by the second filter FP2.

As illustrated in FIG. 12, in the first oscillation state, the first light L1 of the laser diode LD1 is transmitted through the first filter FP1a, reflected by the total reflection mirror 4, and further reflected by the second filter FP2. The first light L1 is re-reflected by the total reflection mirror 4 and transmitted through the first filter FP1b and reaches the half-mirror K2. Therefore, when the transmission wavelength λp1 of the first filter FP1 is in a gain band of the laser diode LD1, the first optical resonator R1 in which the laser diode LD1 performs oscillation is formed. Emission light Lout is emitted from the first optical resonator R1.

On the other hand, the laser diode LD2 forms the third optical resonator R3 with the half-mirror K3. In further detail, the second light L2 of the laser diode LD2 is re-reflected by the total reflection mirror 6 after being reflected by the second filter FP2. The second light L2 is transmitted through the first filter FP1c and transmitted through the third filter FP3 after being reflected by the total reflection mirror 4 and reaches the half-mirror K3. Here, laser oscillation is performed when the transmission wavelengths λp1 of the first filter FP1a, the first filter FP1b, and the first filter FP1c are within a gain band of the laser diode LD2. Through this laser oscillation, the occurrence of a pulse of a high peak value is suppressed at the time of switching from the laser diode LD2 to the laser diode LD1.

Figure 13:
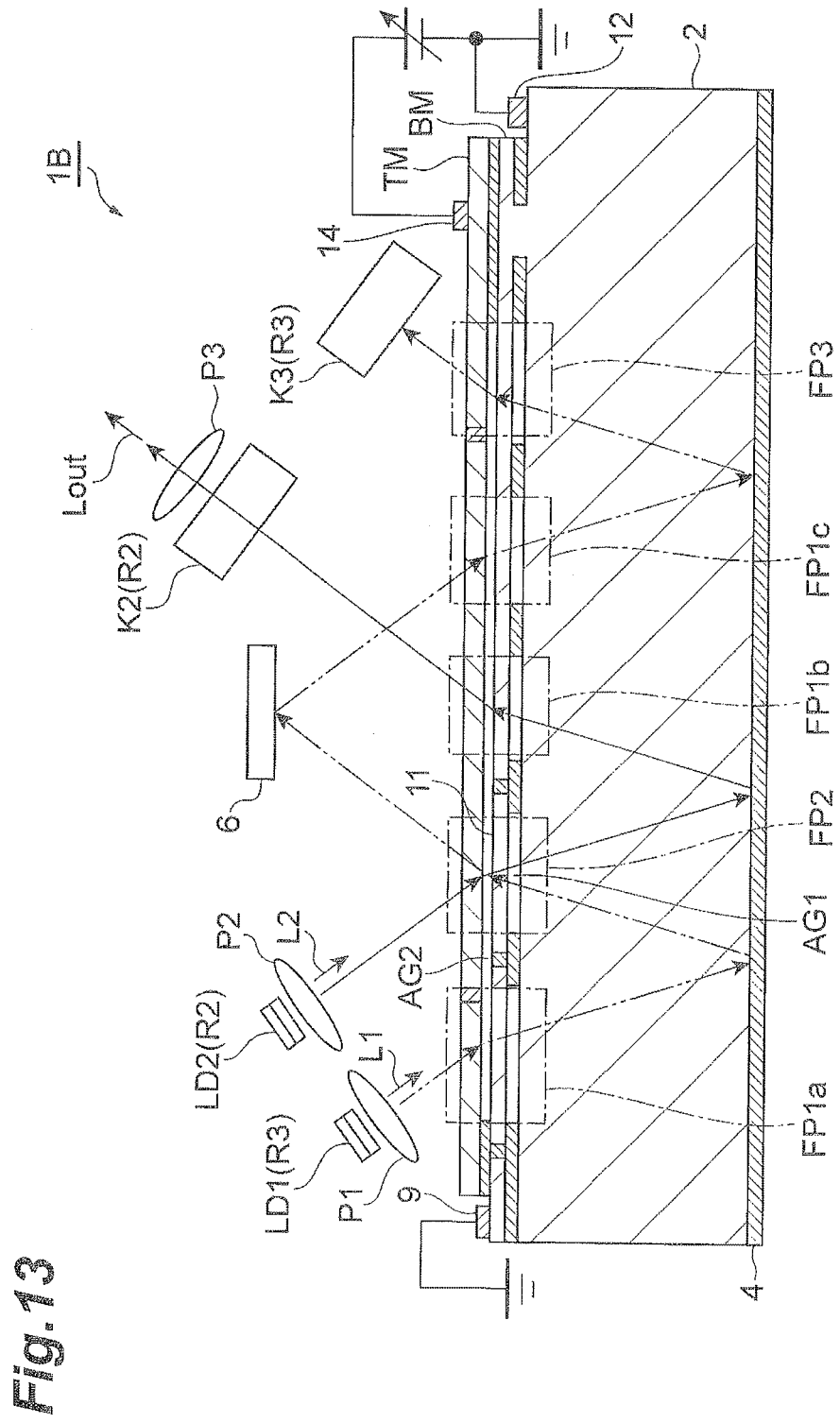
FIG. 13 is a diagram illustrating a second oscillation state in the variable-wavelength light source of FIG. 8.

In the period Z2 (see FIG. 6(a)) in the second oscillation state (see FIG. 4), a control signal (the graph GP1 of FIG. 6(a)) is input to the upper electrode 14 and a control signal (the graph GP2 of FIG. 6(a)) is input to the lower electrode 9. A voltage value V1 of the graph GP2 is the ground potential. In this state, as illustrated in FIG. 13, the movable portion 11 of the lower mirror layer BM is fixed to a predetermined position. The air gap AG2 of the second filter FP2 is equal to the air gap AG2 of the first filter FP1. Therefore, the transmission wavelength λp2 of the second filter FP2 is equal to the transmission wavelengths λp1 of the first filter FP1a, the first filter FP1b, and the first filter FP1c.

In the second oscillation state, the second light L2 of the laser diode LD2 is transmitted through the second filter FP2, reflected by the total reflection mirror 4, and transmitted through the first filter FP1b, and reaches the half-mirror K2. Therefore, the second optical resonator R2 in which the laser diode LD2 performs oscillation is formed.

On the other hand, the laser diode LD1 forms the third optical resonator R3 with the half-mirror K3. In further detail, the first light L1 of the laser diode LD1 is reflected by the total reflection mirror 6 after being transmitted through the first filter FP1a, reflected by the total reflection mirror 4, and transmitted through the second filter FP2. The first light L1 is transmitted through the first filter FP1c and transmitted through the third filter FP3 after being reflected by the total reflection mirror 4 and reaches the half-mirror K3. Here, the laser diode LD1 performs laser oscillation when the transmission wavelengths λp1 of the first filter FP1a, the first filter FP1b, and the first filter FP1c are within a gain band of the laser diode LD1. Through this laser oscillation, the occurrence of a pulse of a high peak value is suppressed at the time of switching from the laser diode LD1 to the laser diode LD2.

[Second Embodiment]

Figure 14:
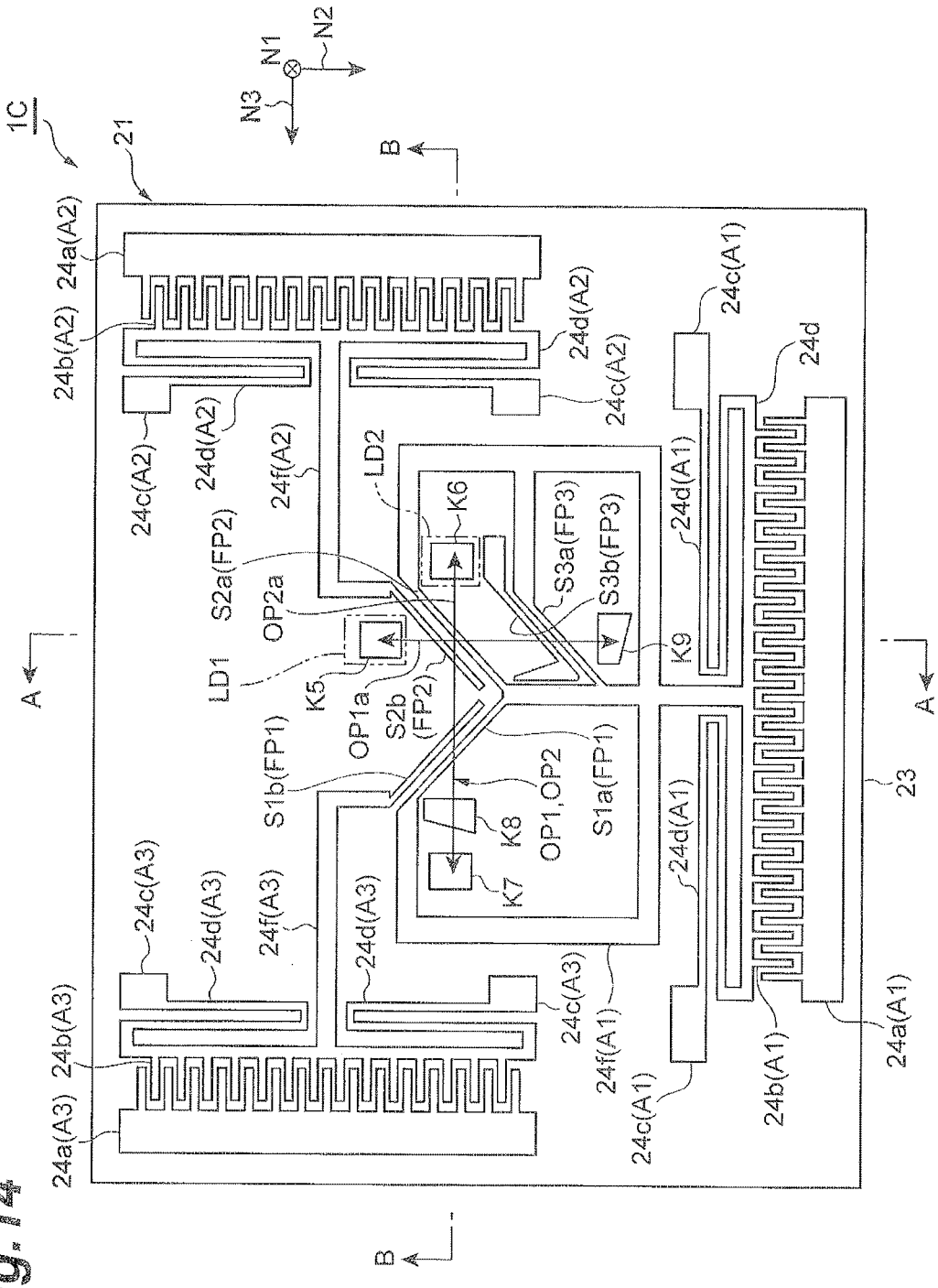
FIG. 14 is a top view of a specific configuration in a variable-wavelength light source of a second embodiment.
Figure 15:
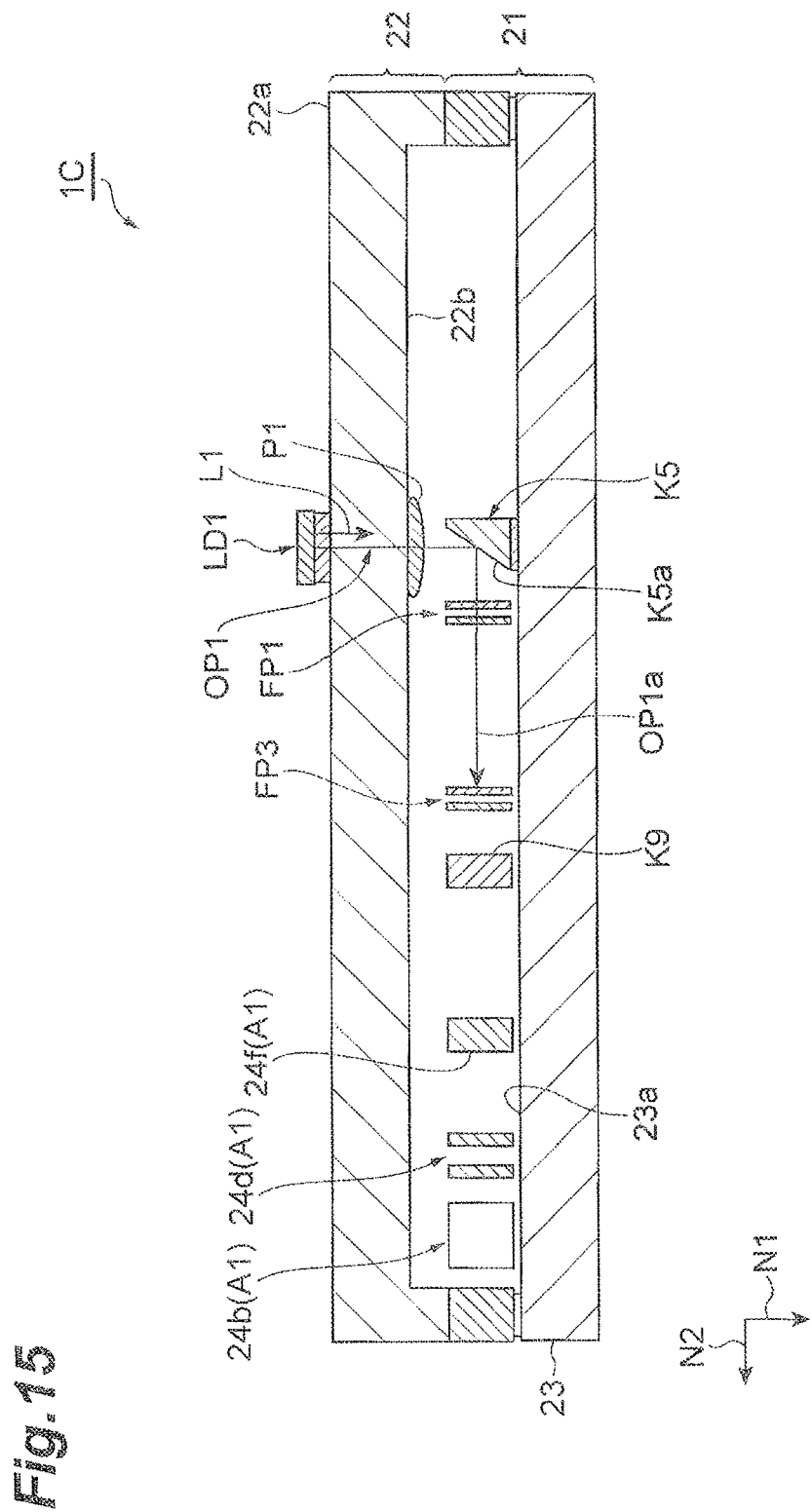
FIG. 15 is a cross-sectional view taken along line A-A of FIG. 14.
Figure 16:
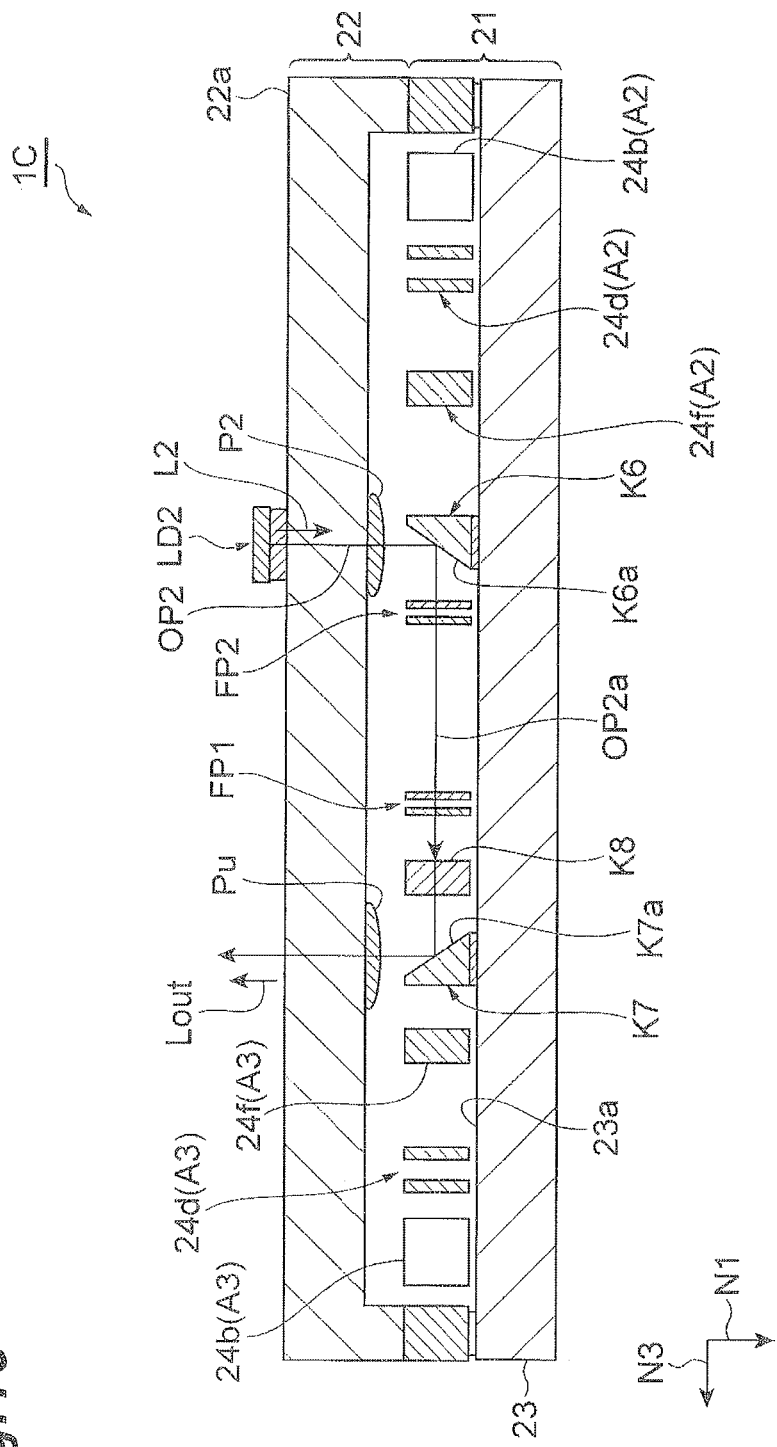
FIG. 16 is a cross-sectional view taken along line B-B of FIG. 14.

A variable-wavelength light source according to the second embodiment will be described. As illustrated in FIGS. 14, 15, and 16, the variable-wavelength light source 1C according to the second embodiment operates based on a basic configuration of the variable-wavelength light source 1A. Hereinafter, a specific configuration of the variable-wavelength light source 1C will be described. The variable-wavelength light source 1C is different from the variable-wavelength light source 1B in that the variable-wavelength light source 1C is manufactured by bulk micromachining using silicon deep etching technology and alkaline etching technology.

The Fabry-Perot type wavelength selecting filter controls a transmission wavelength by changing an air gap between two Bragg mirrors using a voltage value of a control signal. In the Bragg mirrors, layers having different refractive indices are alternately arranged. A relation between a transmission center wavelength λn considering the refractive index of each layer and a thickness t of each layer is set to (λn=¼×t). Also, the relation between the transmission center wavelength λn and the thickness t of each layer may be set as (2×t=n+½×n) (n is an integer greater than or equal to 1). However, when n increases, the reflection wavelength band is narrowed. Therefore, n is set so that the transmission center wavelength λn is less than or equal to the wavelength band BL of the emission light Lout of the variable-wavelength light source. It is only necessary for a relation between the air gap AG and the transmission wavelength λp transmitted through the Fabry-Perot interference filter to be (2×AG=n×λp). However, when n increases, there is a higher-order wavelength λp in the transmission band of the Fabry-Perot interference filter. Accordingly, n is set so that there are not a plurality of transmission wavelengths λp within the wavelength band BL of the emission light Lout in the variable-wavelength light source.

When surface micromachining is used, the thickness of each layer is set to 1 μm or less from film formation control characteristics or practical aspects because a film for configuring a Bragg mirror is formed using chemical vapor deposition (CVD) or the like. In the variable-wavelength light source 1B, the wavelength band BL of the emission light Lout, for example, is a band of 1.3 μm. In this case, all the thicknesses of the polysilicon film T2, the air gap AG1, and the air gap AG2 are substantially several hundred nm. On the other hand, when the wavelength selecting filter targeting light having a wavelength of several μm which is a longer wavelength is formed, the thickness of each layer exceeds 1 μm. Accordingly, in the surface micromachining, the difficulty of manufacturing increases. A manufacturing method using the bulk micromachining is suitable for a variable-wavelength light source targeting this long wavelength band.

As illustrated in FIG. 14, the variable-wavelength light source 1C has an MEMS structure 21 and a cover 22 (see FIG. 15). The cover 22 is arranged on the MEMS structure 21. The MEMS structure 21 has a silicon substrate 23. The first filter FP1, the second filter FP2, the third filter FP3, the first drive mechanism A1, the second drive mechanism A2, and the third drive mechanism A3 are formed in this silicon substrate 23. Further, a half-mirror K8, a half-mirror K9, a first direction changing mirror K5, a second direction changing mirror K6, and a third direction changing mirror K7 are formed in the silicon substrate 23. On the other hand, the laser diode LD1, the laser diode LD2, the lens P1, the lens P2, and the output lens Pu are provided in the cover 22.

As illustrated in FIG. 15, the laser diode LD1 is a surface light-emitting laser element configured to emit the first light L1 to the first optical path OP1. The laser diode LD1 is arranged on an outer surface 22a of the cover 22. The lens P1 is arranged in an inner surface 22b of the cover 22 on the first optical path OP1. As illustrated in FIG. 16, the laser diode LD2 is a surface light-emitting laser element configured to emit the second light L2 to the second optical path OP2. The laser diode LD2 is arranged in the outer surface 22a of the cover 22. The lens P2 is arranged in the inner surface 22b on the second optical path OP2.

As illustrated in FIG. 15, the first direction changing mirror K5 changes the direction of the first optical path OP1 90 degrees from a direction N1 perpendicular to the surface 23a of the silicon substrate 23 to a direction N2 along the surface 23a of the silicon substrate 23. Therefore, the first direction changing mirror K5 has a reflection surface K5a tilted 45 degrees in the direction N1.

As illustrated in FIG. 16, the second direction changing mirror K6 changes the direction of the second optical path OP2 90 degrees from the direction N1 perpendicular to the surface 23a of the silicon substrate 23 to the direction N2 along the surface 23a of the silicon substrate 23. Therefore, the second direction changing mirror K6 has a reflection surface K6a tilted 45 degrees in the direction N1.

As illustrated in FIG. 14, the first direction changing mirror K5 and the second direction changing mirror K6 are arranged so that a first optical path OP1a changed in direction by the first direction changing mirror K5 forms an angle of 90 degrees with a second optical path OP2a changed in direction by the second direction changing mirror K6.

As illustrated in FIG. 16, the third direction changing mirror K7 is arranged on the second optical path OP2a changed in direction by the second direction changing mirror K6. The third direction changing mirror K7 changes the directions of the first optical path OP1 and the second optical path OP2 90 degrees so that incident light travels to the output lens Pu.

It is difficult to form the first direction changing mirror K5, the second direction changing mirror K6, and the third direction changing mirror K7 using a deep reactive ion etching (DRIE) method. However, it is possible to form the first direction changing mirror K5, the second direction changing mirror K6, and the third direction changing mirror K7 in which angles of a reflection surface K5a, a reflection surface K6a, and a reflection surface K7a are controlled with high precision by jointly using a crystal anisotropic etching method with an alkaline solution.

On the first optical path OP1 and the second optical path OP2 changed in direction by the third direction changing mirror K7, the output lens Pu is provided in the inner surface 22b of the cover 22.

As illustrated in FIG. 14, the half-mirror K8 forms the first optical resonator R1 and the second optical resonator R2. The half-mirror K8 is arranged between the second direction changing mirror K6 and the third direction changing mirror K7 on the second optical path OP2 changed in direction by the second direction changing mirror K6. The half-mirror K9 forms the third optical resonator R3. The half-mirror K9 is arranged on the first optical path OP1a changed in direction by the first direction changing mirror K5.

The half-mirror K8 and the half-mirror K9 have a configuration using Fresnel reflection in an end surface due to a refractive index difference between silicon and air. Reflectance of the half-mirror K8 and the half-mirror K9 has significantly small dependence on a wavelength in a wavelength band in several μm and is substantially about 30%. In the half-mirror K8 and the half-mirror K9, any one surface of an incidence surface and an emission surface is tilted toward the other surface. Through this structure, it is possible to suppress a phenomenon in which multi-reflection occurs when the incidence surface and the emission surface of the half-mirror K8 and the half-mirror K9 are parallel to each other and reflectance changes for each wavelength. Although the emission light of the half-mirror K8 is slightly bent by the tilt angle, only an extraction position and angle at the emission side change and an operation of the variable-wavelength light source 1C is not affected. Also, the half-mirror K8 and the half-mirror K9 can be formed using the DRIE method.

The first filter FP1, the second filter FP2, and the third filter FP3 are formed in the MEMS structure 21. The second filter FP2 is arranged at an intersection between the first optical path OP1a changed in direction by the first direction changing mirror K5 and the second optical path OP2a changed in direction by the second direction changing mirror K6. The first filter FP1 is arranged between the second filter FP2 and the half-mirror K8 on the second optical path OP2a changed in direction by the second direction changing mirror K6. The third filter FP3 is arranged between the second filter FP2 and the half-mirror K9 on the first optical path OP1a changed in direction by the first direction changing mirror K5.

A first mirror S1a of the first filter FP1, a second mirror S2a of the second filter FP2, and a third mirror S3a of the third filter FP3 are all connected to the first drive mechanism A1. Therefore, the first mirror S1a, the second mirror S2a, and the third mirror S3a constantly perform the same operation. The other first mirror S1b of the first filter FP1 is connected to the third drive mechanism A3. Therefore, the other first mirror S1b is operable independent of the one first mirror S1a. The other second mirror S2b of the second filter FP2 is connected to the second drive mechanism A2. Therefore, the other second mirror S2b is operable independent of the one second mirror S2a. The other third mirror S3b of the third filter FP3 is fixed to the silicon substrate 23.

The first mirror S1a, the second mirror S2a, and the third mirror S3a attached to the first drive mechanism A1 reciprocate at a high speed for frequency sweep. Through this operation, each mirror may be deflected due to inertia. Therefore, the first mirror S1a, the second mirror S2a, and the third mirror S3a have a both-end supporting structure in which both ends of each mirror are connected to the first drive mechanism A1.

On the other hand, operations of the other second mirror S2b connected to the second drive mechanism A2 and the other first mirror S1b connected to the third drive mechanism A3 are slower than those of the mirrors attached to the first drive mechanism A1 and have smaller movement amounts than those of the mirrors attached to the first drive mechanism A1. According to this operation, the deflection when the second mirror S2b and the first mirror S1b are operated is negligibly small. Therefore, the second mirror S2b has a cantilever supporting structure in which one end is connected to the second drive mechanism. Similarly, the first mirror S1b has a cantilever supporting structure in which one end of the mirror is connected to the third drive mechanism A3.

A semiconductor layer including silicon can be used in the first filter FP1, the second filter FP2, and the third filter FP3 because silicon is transparent to infrared light.

In the variable-wavelength light source 1C formed by the bulk micromachining, an electrostatic actuator is used as a drive mechanism. The first drive mechanism A1, the second drive mechanism A2, and the third drive mechanism A3 are electrostatic actuators. The first drive mechanism A1, the second drive mechanism A2, and the third drive mechanism A3 have a fixed electrode 24a and a movable electrode 24b with a comb-tooth structure. The fixed electrode 24a is fixed to the silicon substrate 23. On the other hand, the movable electrode 24b is separated above the silicon substrate 23 and movable to the silicon substrate 23. By applying a voltage to the fixed electrode 24a and the movable electrode 24b, an electrostatic force is generated to drive the movable electrode 24b. A spring 24d and a frame 24f are connected to the movable electrode 24b. The spring 24d extends from an anchor 24c fixed to the MEMS structure 21. The frame 24f connects the mirrors constituting the Fabry-Perot interference filter. The movable electrode 24b, the anchor 24c, the spring 24d, and the frame 24f are integrally formed.

The first mirror S1a, the second mirror S2a, and the third mirror S3a are connected to the first drive mechanism A1. The first drive mechanism A1 operates the first mirror S1a, the second mirror S2a, and the third mirror S3a in the direction of the first optical path OP1 changed in direction by the first direction changing mirror K5. The other second mirror S2b is connected to the second drive mechanism A2. The second drive mechanism A2 operates the second mirror S2b in the direction of the second optical path OP2 changed in direction by the second direction changing mirror K6. The other first mirror S1b is connected to the third drive mechanism A3. The third drive mechanism A3 operates the first mirror S1b in the direction of the second optical path OP2 changed in direction by the second direction changing mirror K6.

The first drive mechanism A1 constitutes a spring-mass vibration system. The frame 24f the first mirror S1a, the second mirror S2a, and the third mirror S3a constitute a mass system. The spring 24d constitutes a spring system. Therefore, a resonance frequency of the first drive mechanism A1 is defined by total mass m of the frame 24f, the first mirror S1a, the second mirror S2a, and the third mirror S3a, an elastic coefficient k of the spring 24d, and an attenuation coefficient ξ. The resonance frequency of the first drive mechanism A1 is set to a desired value by designating the mass of the frame 24f or the like and the dimensions or the like of the spring 24d as design parameters.

The third drive mechanism A3 adjusts the first gap G1 between the first mirror S1a and the first mirror S1b of the first filter FP1. Ideally, the first gap G1 of the first filter FP1 and the second gap G2 of the second filter FP2 are designed to be equal to each other. However, an exact match is difficult due to variations in manufacturing. Therefore, the variable-wavelength light source 1C has the third drive mechanism A3 for correcting the variations. Also, when the variable-wavelength light source 1C can be manufactured so that the first gap G1 of the first filter FP1 and the second gap G2 of the second filter FP2 precisely match, the variable-wavelength light source 1C may not have the third drive mechanism A3. In this case, the other first mirror S1b of the first filter FP1 is fixed to the silicon substrate 23.

An operation of the variable-wavelength light source 1C will be described. In the periods Z1 and Z3 (see FIG. 6(a)) in the first oscillation state (see FIG. 4), a control signal (the graph GP2 of FIG. 6(a)) is input between the fixed electrode 24a and the movable electrode 24b of the second drive mechanism A2 and a control signal (the graph GP1 of FIG. 6(a)) is input between the fixed electrode 24a and the movable electrode 24b of the first drive mechanism A1. Through these control signals, a state in which light transmitted through the first filter FP1 is reflected by the second filter FP2 is reached. Because the transmission wavelength λp1 of the first filter FP1 changes within a gain band of the laser diode LD1, the first optical resonator R1 is formed. Therefore, the laser diode LD1 performs oscillation and the emission light Lout is emitted from the variable-wavelength light source 1C.

Also, in the first oscillation state, the laser diode LD2 forms the third optical resonator R3 with the half-mirror K9. Through the laser oscillation, the occurrence of a pulse of a high peak value is suppressed at the time of switching from the laser diode LD2 to the laser diode LD1.

Next, in the period Z2 (see FIG. 6(a)) in the second oscillation state (see FIG. 4), a control signal (the graph GP2 of FIG. 6(a)) is input to the fixed electrode 24a of the second drive mechanism A2 and a control signal (the graph GP1 of FIG. 6(a)) is input between the fixed electrode 24a and the movable electrode 24b of the first drive mechanism A1. Through these control signals, a state in which light transmitted through the first filter FP1 is reflected by the second filter FP2 is reached. Because the transmission wavelength λp1 of the first filter FP1 changes within a gain band of the laser diode LD2, the second optical resonator R2 is formed. Therefore, the laser diode LD2 performs oscillation and the emission light Lout is emitted from the variable-wavelength light source 1C.

Also, in the second oscillation state, the laser diode LD1 forms the third optical resonator R3 with the half-mirror K9. Through the laser oscillation, the occurrence of a pulse of a high peak value is suppressed at the time of switching from the laser diode LD1 to the laser diode LD2.

The above-described variable-wavelength light source 1C has similar effects to the variable-wavelength light source 1A.

Further, because the variable-wavelength light source 1C is manufactured by bulk micromachining, it is possible to emit the emission light Lout having a longer wavelength than the variable-wavelength light source 1B manufactured according to surface micromachining. For example, it is possible to manufacture a Fabry-Perot wavelength selecting filter in which the thickness of the silicon layer is 2 μm to 3 μm and the first gap G1, the second gap G2, and the third gap G3 are 3 μm to 7 μm. Through the wavelength selecting filter having the above-described thickness and gap lengths, it is possible to set the transmission wavelength to a wavelength band of several μm and emit the emission light Lout having a wavelength of several μm (for example, 5 μm).

In the variable-wavelength light source 1C, a surface light-emitting element such as a VCSEL or the like and is used and a cover in which a lens made of a silicon substrate is molded or attached is arranged on the MEMS structure 21. Through this configuration, the variable-wavelength light source 1C has a smaller size and can be easily assembled.

The MEMS structure 21 of the variable-wavelength light source 1C can be created using a silicon DRIE method for a silicon on insulator (SOI) substrate. It is possible to implement a Bragg mirror for the Fabry-Perot type wavelength selecting filter by alternately arranging a silicon layer and an air layer according to the DRIE method. At this time, because the electrostatic actuator and the Bragg mirror can be created by one-time silicon DRIE using the same photo mask, the MEMS structure 21 of the variable-wavelength light source 1C can be precisely created in fewer processes.

Components other than the first direction changing mirror K5, the second direction changing mirror K6, and the third direction changing mirror K7 can all be created using the one-time DRIE method. Therefore, it is possible to precisely control a relative positional relation. Thus, adjustment other than alignment of the laser diode LD1 and the output lens Pu and alignment of the laser diode LD2 and the output lens Pu is unnecessary.

Although an embodiment of the present invention has been described above, the present invention is not limited to the above-described embodiment.

Figure 17:
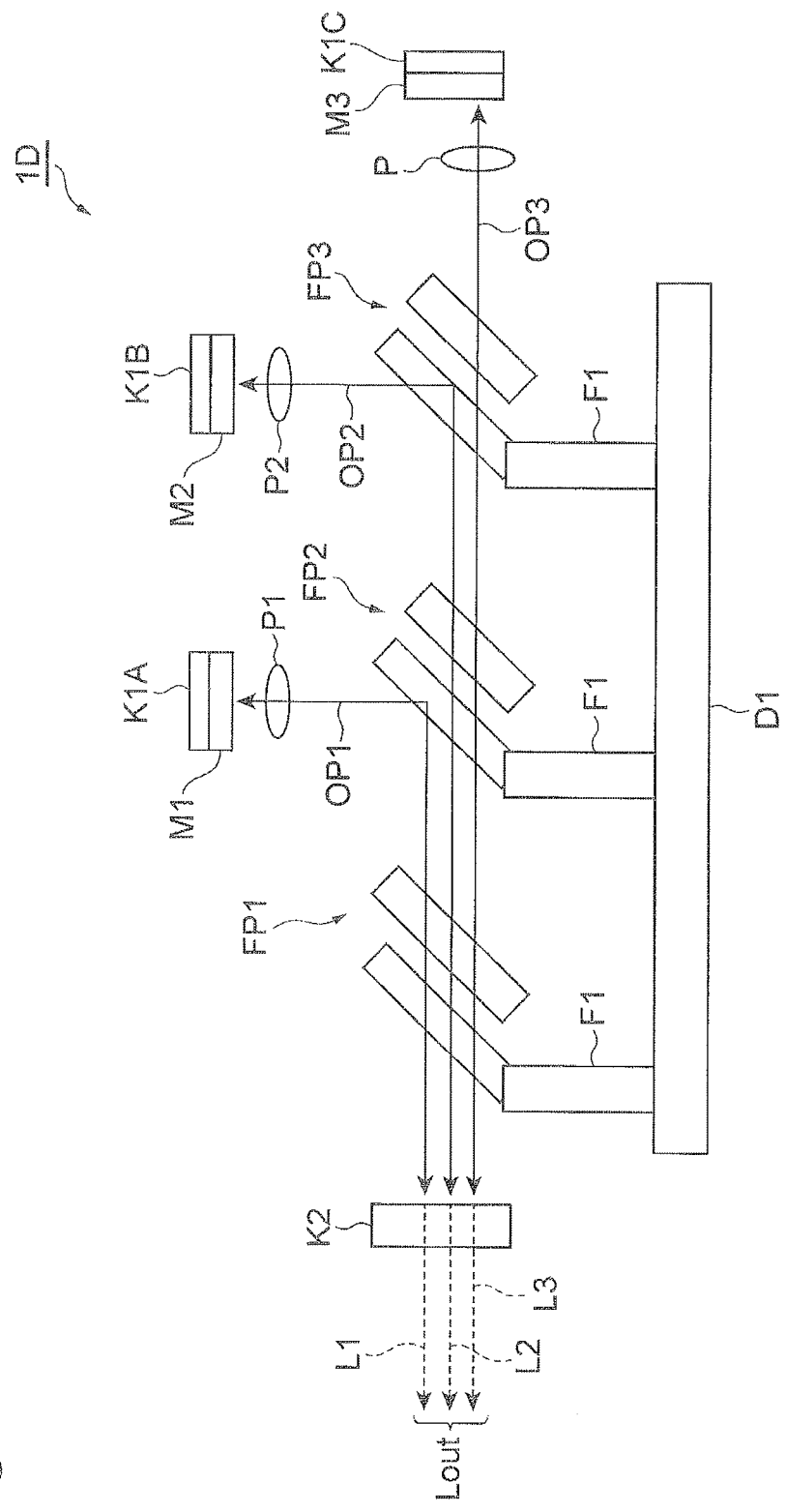
FIG. 17 is a diagram illustrating a basic configuration of a variable-wavelength light source of modified example 1.

As illustrated in FIG. 17, a variable-wavelength light source 1D of modified example 1 may include three laser media including a first laser medium M1, a second laser medium M2, and a third laser medium M3.

Figure 18:
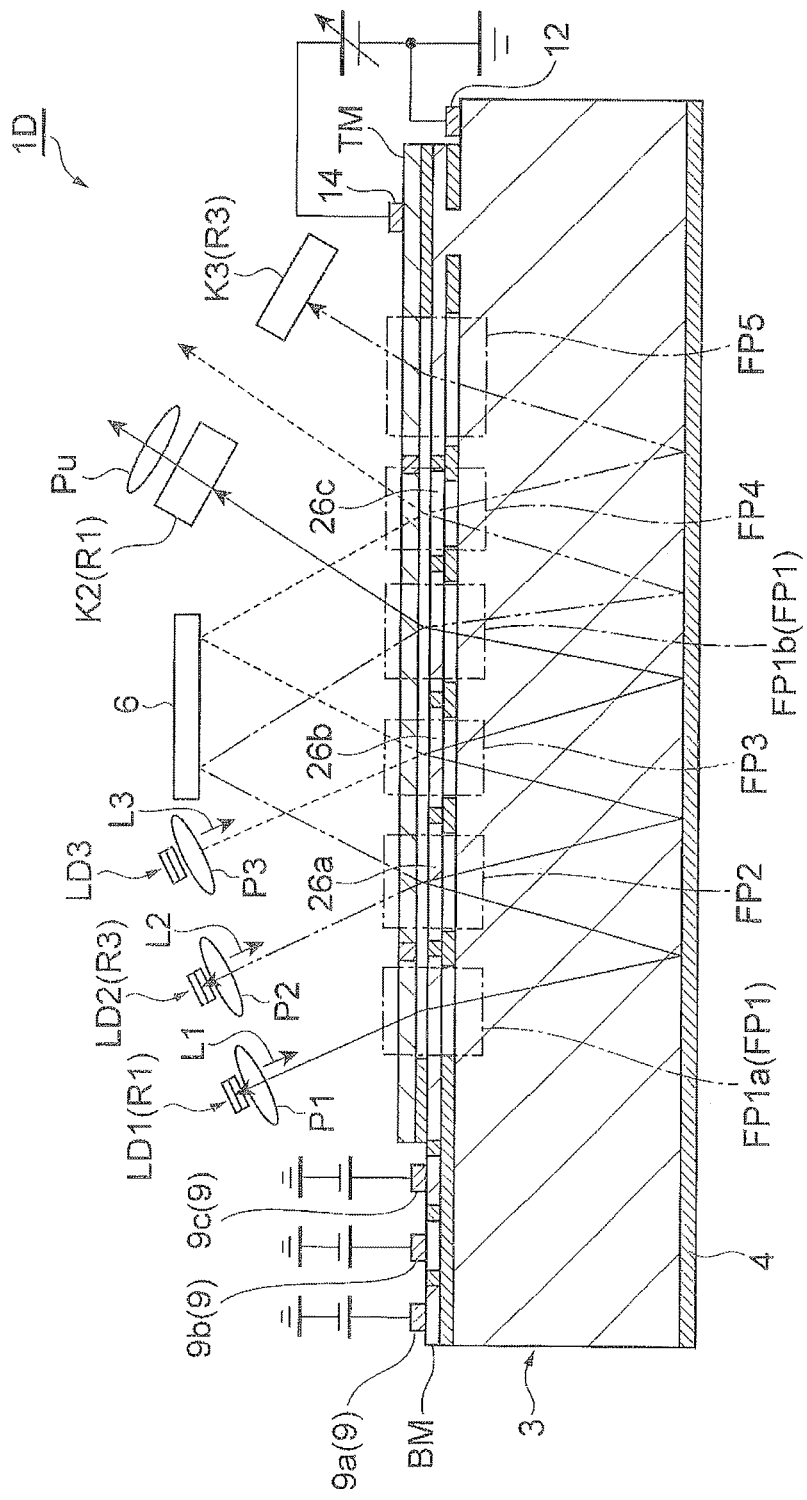
FIG. 18 is a diagram illustrating a first oscillation state in a specific configuration of the variable-wavelength light source of modified example 1.
Figure 19:
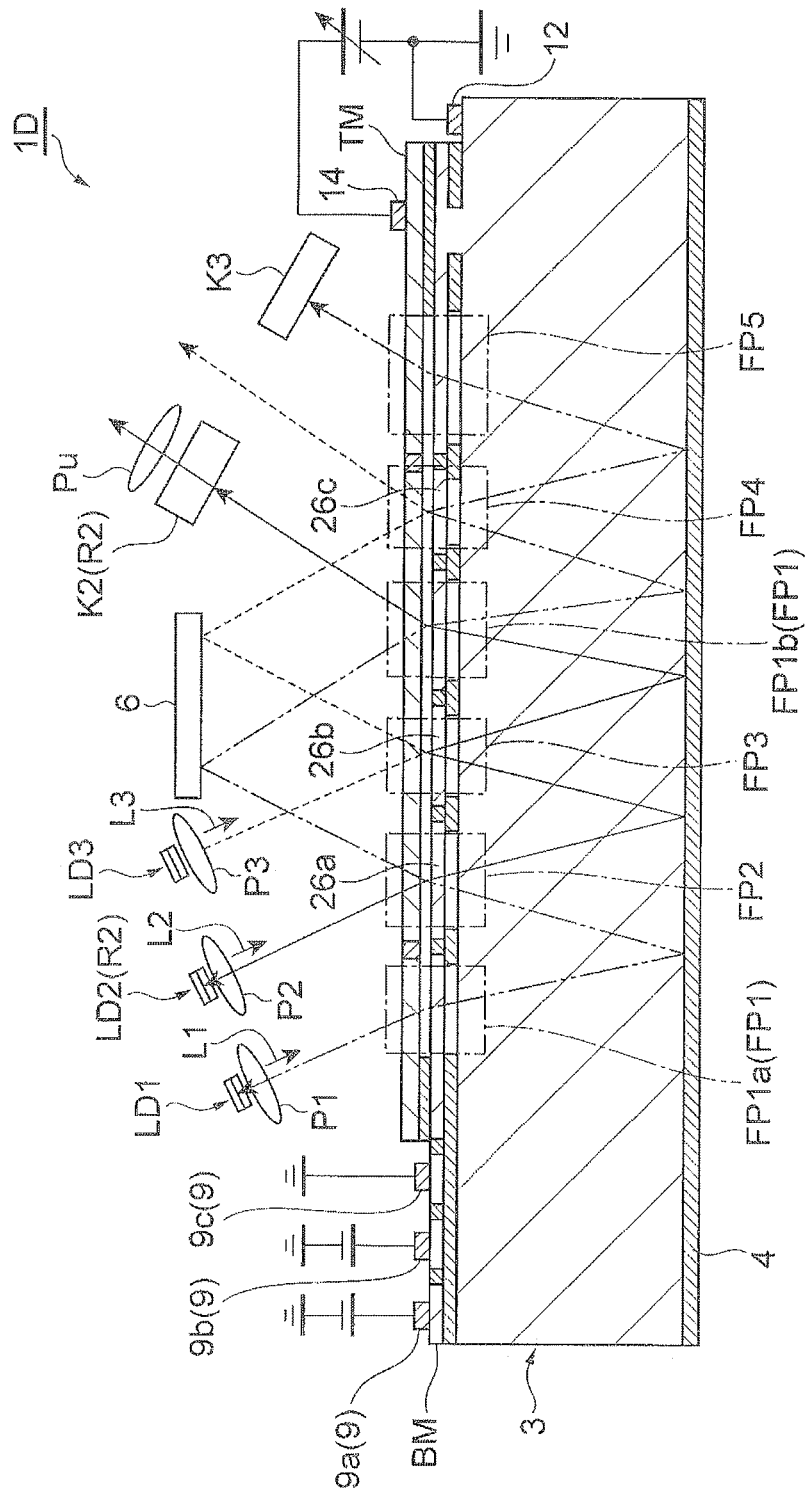
FIG. 19 is a diagram illustrating a second oscillation state in the specific configuration of the variable-wavelength light source of modified example 1.

As illustrated in FIGS. 18 and 19, the variable-wavelength light source 1D formed by the surface micromachining includes a first filter FP1, a second filter FP2, and a third filter FP3. First light L1 of a laser diode LD1 is incident on a first filter FP1a, second light L2 of a laser diode LD2 is incident on the second filter FP2, and third light L3 of a laser diode LD3 is incident on the third filter FP3.

Fabry-Perot interference filters are provided in parallel in the order of the first filter FP1a, the second filter FP2, and the third filter FP3. A first filter FP1b, a fourth Fabry-Perot interference filter FP4 (hereinafter referred to as "fourth filter FP4"), and a fifth Fabry-Perot interference filter FP5 (hereinafter referred to as "fifth filter FP5") are adjacent to the third filter FP3 in this order.

A plurality of movable portions 26a, 26b, and 26c surrounded by an insulation region are formed in a lower mirror layer BM constituting the second filter FP2. The movable portion 26a surrounded by the insulation region is formed in the region of the lower mirror layer BM constituting the second filter FP2. A first lower electrode 9a is electrically connected to the movable portion 26a and a predetermined voltage can be applied to the movable portion 26a. In the region of the lower mirror layer BM constituting the third filter FP3, the movable portion 26b surrounded by the insulation region is formed. A second lower electrode 9b is electrically connected to the movable portion 26b and a predetermined voltage can be applied to the movable portion 26b. In the region of the lower mirror layer BM constituting the fourth filter FP4, the movable portion 26c surrounded by the insulation region is formed. A third lower electrode 9c is electrically connected to the movable portion 26c and a predetermined voltage can be applied to the movable portion 26c.

An operation of the variable-wavelength light source 1D will be described. In order to set a first oscillation state, a voltage which is not a ground potential GND is applied to each of the movable portion 26a of the second filter FP2, the movable portion 26b of the third filter FP3, and the movable portion 26c of the fourth filter FP4. In this case, light transmitted through the first filter FP1a, the first filter FP1b, and the fifth filter FP5 is reflected by the second filter FP2, the third filter FP3, and the fourth filter FP4. Therefore, as illustrated in FIG. 18, the laser diode LD1 forms a first optical resonator R1 with a half-mirror K2 and laser oscillation is performed at a transmission wavelength $\lambda p1$ transmitted through the first filters FP1a and FP1b and the fifth filter FP5.

After the laser diode LD1, the laser diode LD2 performs oscillation. Because the laser diode LD2 constitutes the third optical resonator R3 with the half-mirror K3 at the time of switching from the laser diode LD1 to the laser diode LD2, laser oscillation of a high peak value is suppressed.

The third light L3 of the laser diode LD3 is reflected by a total reflection mirror 6 after being reflected by the third filter FP3 and further reflected by the fourth filter FP4. However, no reflection mirror is arranged on an optical path of light reflected by the fourth filter FP4. Therefore, the third light L3 of the laser diode LD3 does not oscillate. That is, in the first oscillation state in which the laser diode LD1 performs oscillation, the laser diode LD3 is constantly in a non-oscillation state. However, the laser diodes LD1, LD2, and LD3 that perform oscillation are switched in the order of the laser diodes LD1, LD2, LD3, LD2, and LD1. That is, because switching to the laser diode LD3 after the laser diode LD1 is not performed, it is unnecessary to consider a problem of laser oscillation of a high peak value for the laser diode LD3 during the first oscillation state.

In order to set the second oscillation state in which the laser diode LD2 performs oscillation, a ground potential GND is applied to the movable portion 26a of the second filter FP2. In addition, voltages which are not the ground potential GND are applied to the movable portions 26b and 26c of the third filter FP3 and the fourth filter FP4. In this state, the transmission wavelength $\lambda p2$ of the second filter FP2 is equal to the transmission wavelengths $\lambda p1$ of the first filter FP1a, the first filter FP1b, and the fifth filter FP5. Therefore, as illustrated in FIG. 19, the laser diode LD2 forms the second optical resonator R2 with the half-mirror K2 and performs laser oscillation at the transmission wavelength $\lambda p2$ of the second filter FP2.

Figure 20:
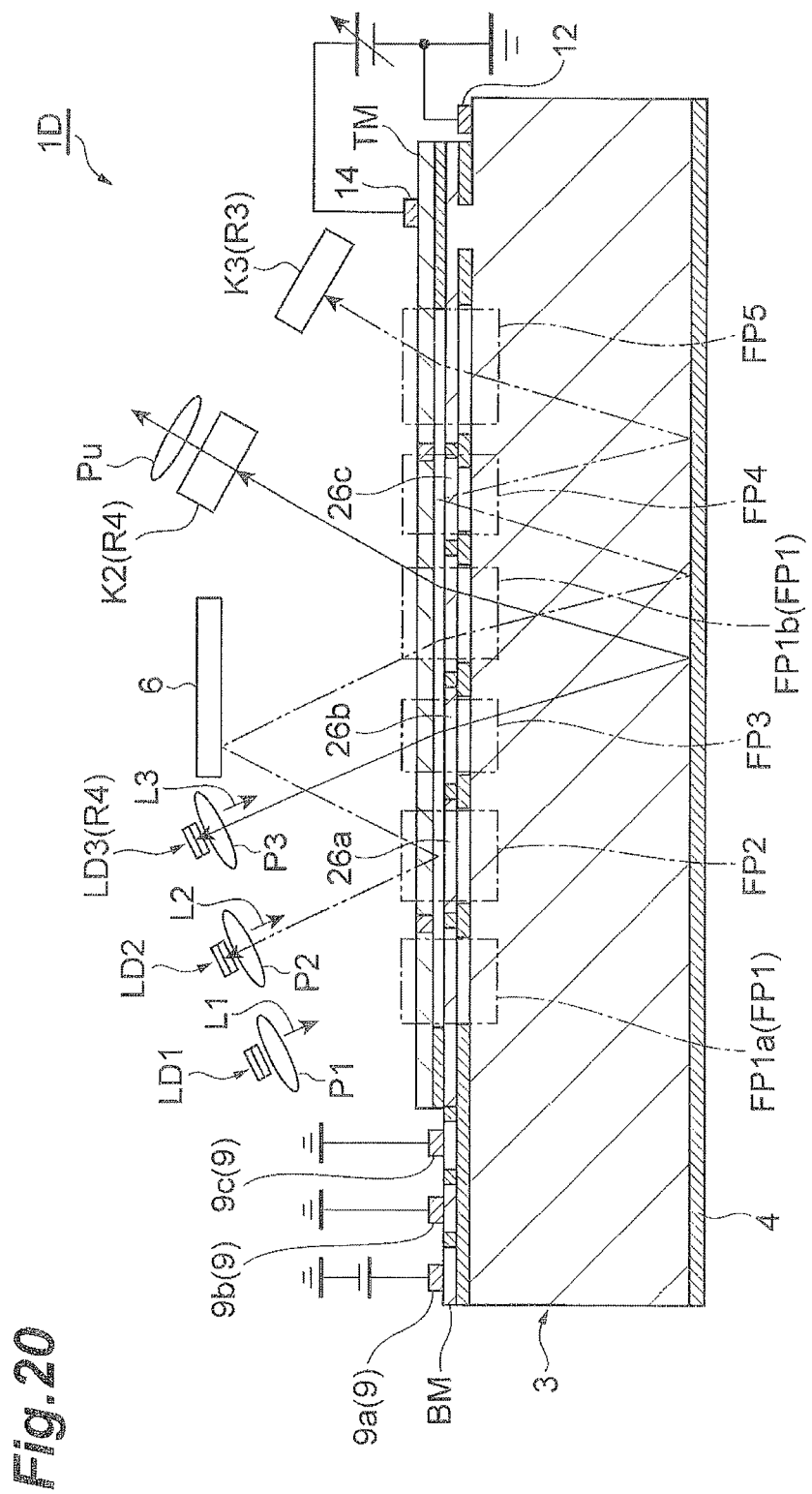
FIG. 20 is a diagram illustrating a third oscillation state in the specific configuration of the variable-wavelength light source of modified example 1.

In order to set the third oscillation state in which the laser diode LD3 performs oscillation, the ground potential GND is applied to the movable portion 26a of the second filter FP2 and the movable portion 26b of the third filter FP3. A voltage which is not the ground potential GND is applied to the movable portion 26c of the fourth filter FP4. In this state, the transmission wavelength $\lambda p2$ of the second filter FP2 and the transmission wavelength $\lambda p3$ of the third filter FP3 are equal to the transmission wavelengths $\lambda p1$ of the first filter FP1a, the first filter FP1b, and the fifth filter FP5. Therefore, as illustrated in FIG. 20, the laser diode LD3 forms the fourth optical resonator R4 with the half-mirror K2 and performs laser oscillation at the transmission wavelength $\lambda p3$ of the third filter FP3.

Even in the configuration in which the laser diodes LD1, LD2, and LD3 are provided, a mirror to be operated at a high speed to sweep the wavelength of the emission light Lout is the upper mirror layer TM. The movable portions 26a, 26b, and 26c of the lower mirror layer BM operate at a low speed, need only be slightly changed, and can be easily controlled.

According to the variable-wavelength light source 1D, it is possible to switch three laser media including the first laser medium M1, the second laser medium M2, and the third laser medium M3 and further extend a wavelength band BL of the emission light Lout.

Also, the variable-wavelength light source can include three or more laser media in principle by applying the above-described configuration. However, when the number of laser media increases, the optical path length of the optical resonator is lengthened. In order to improve the purity of a selected wavelength in the Fabry-Perot interference filter, it is preferable that beams incident on the Fabry-Perot interference filter be parallel light. However, the deviation from the parallel light increases when the optical path length of the optical resonator increases because the beams have a diffraction spread. Therefore, when the optical path length of the optical resonator increases, the wavelength selectivity becomes poor. Because there is an effective wavelength band even in the Fabry-Perot interference filter, it is difficult to indefinitely increase the number of laser media. Therefore, the number of laser media capable of being provided in the variable-wavelength light source is about three.

Figure 21:
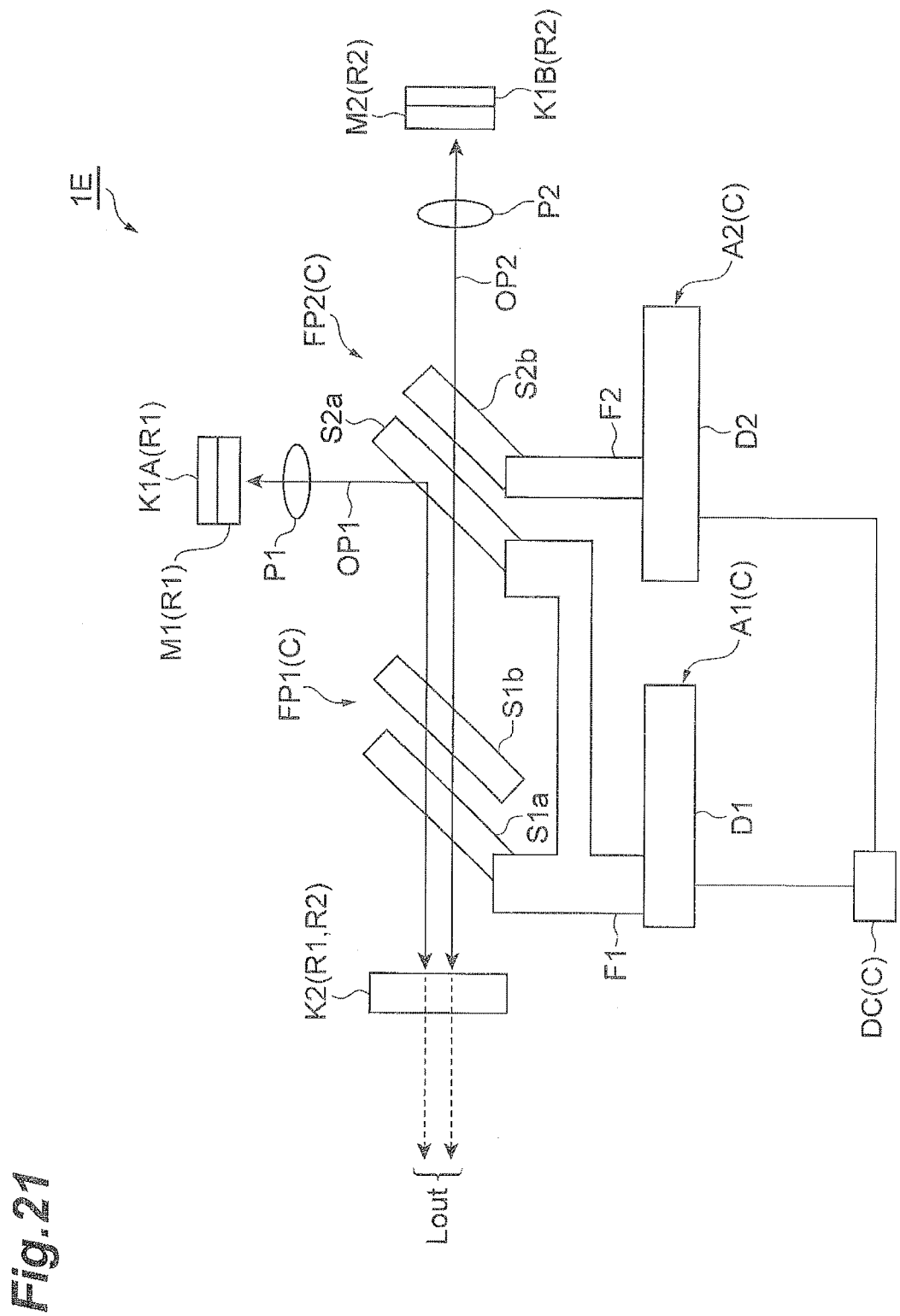
FIG. 21 is a diagram illustrating a basic configuration of a variable-wavelength light source of modified example 2.

As illustrated in FIG. 21, a variable-wavelength light source 1E of modified example 2 may have a configuration in which there is no third optical resonator R3 for preventing a pulse of a high peak value from occurring. According to the variable-wavelength light source 1E, it is possible to create a variable-wavelength laser light source having a wide wavelength band BL of the emission light Lout as in the variable-wavelength light source 1A. Because the structure of the variable-wavelength light source 1E is simpler than that of the variable-wavelength light source 1A, the variable-wavelength light source 1E can be easily manufactured.

Although the first and second partial reflection mirrors are an integrated half-mirror K2 in the first and second embodiments, the first and second partial reflection mirrors may be half-mirrors separate from each other.

INDUSTRIAL APPLICABILITY

According to the present invention, a variable-wavelength light source capable of stabilizing optical characteristics of emission light and extending a wavelength band of the emission light is provided.

REFERENCE SIGNS LIST 1A to 1E Variable-wavelength light source
2, 23 Silicon substrate (semiconductor substrate)
A1 First drive mechanism
A2 Second drive mechanism
B1 First wavelength band
B2 Second wavelength band
DC Drive control unit (control unit)
FP1 First filter (first Fabry-Perot interference filter)
FP2 Second filter (second Fabry-Perot interference filter)
G1 First gap
G2 Second gap
K1A Total reflection mirror (first total reflection mirror)
K1B Total reflection mirror (second total reflection mirror)

K2 Half-mirror (first partial reflection mirror, second partial reflection mirror)
L1 First light
L2 Second light
L3 Third light
Lout Emission light
M1 First laser medium
M2 Second laser medium
OP1 First optical path
OP2 Second optical path
P1 Lens (first optical component)
P2 Lens (second optical component)
R1 First optical resonator
R2 Second optical resonator
S1a, S1b First mirror
S2a, S2b Second mirror
S3a, S3b Third mirror

The invention claimed is:

1. A variable-wavelength light source comprising:
   a first laser medium configured to amplify first light having a first wavelength band;
   a first total reflection mirror and a first partial reflection mirror constituting a first optical resonator configured to cause the first light to optically resonate;
   a second laser medium configured to amplify second light having a second wavelength band;
   a second total reflection mirror and a second partial reflection mirror constituting a second optical resonator configured to cause the second light to optically resonate;
   a first Fabry-Perot interference filter having a pair of first mirrors, arranged at a first position which is a position between the first laser medium and the first partial reflection mirror on a first optical path of the first light and is a position between the second laser medium and the second partial reflection mirror on a second optical path of the second light, and configured to cause the first light and the second light to be transmitted and reflected selectively;
   a second Fabry-Perot interference filter having a pair of second mirrors, arranged at a second position which is a position between the first laser medium and the first Fabry-Perot interference filter on the first optical path and is a position between the second laser medium and the first Fabry-Perot interference filter on the second optical path, and configured to cause the first light and the second light to be transmitted and reflected selectively;
   a first drive mechanism configured to operate one first mirror of the first Fabry-Perot interference filter and one second mirror of the second Fabry-Perot interference filter in conjunction with each other; and
   a second drive mechanism configured to operate the other second mirror of the second Fabry-Perot interference filter.

2. The variable-wavelength light source according to claim 1, further comprising:
   a control unit configured to control the first drive mechanism so that a first gap between the pair of first mirrors and a second gap between the pair of second mirrors periodically change.

3. The variable-wavelength light source according to claim 2, wherein the control unit causes the one first mirror and the one second mirror to reciprocate and sets a frequency of the reciprocating operation to a resonance frequency of the first drive mechanism.

4. The variable-wavelength light source according to claim 2, wherein the control unit controls the second drive mechanism so that a state of the second mirror is switched between a first state in which the second gap is different from the first gap and a second state in which the second gap is equal to the first gap.

5. The variable-wavelength light source according to claim 1, wherein the first Fabry-Perot interference filter, the second Fabry-Perot interference filter, the first drive mechanism, and the second drive mechanism are formed in the same semiconductor substrate.

6. The variable-wavelength light source according to claim 1, further comprising:
   a first optical component arranged at a position between the first laser medium and the second Fabry-Perot interference filter on the first optical path and configured to collimate the first light; and
   a second optical component arranged at a position between the second laser medium and the second Fabry-Perot interference filter on the second optical path and configured to collimate the second light.

* * * * *